United States Patent
Dogruoz et al.

(10) Patent No.: US 11,523,541 B2
(45) Date of Patent: Dec. 6, 2022

(54) THERMAL MANAGEMENT OF HIGH CAPACITY OPTICS IN DENSE ARRANGEMENTS

(71) Applicant: Cisco Technology, Inc., San Jose, CA (US)

(72) Inventors: M. Baris Dogruoz, Campbell, CA (US); Mandy Hin Lam, Fremont, CA (US); Mark Nowell, Ontario (CA); Rakesh Chopra, Menlo Park, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/928,279

(22) Filed: Jul. 14, 2020

(65) Prior Publication Data

US 2021/0282301 A1  Sep. 9, 2021

Related U.S. Application Data

(60) Provisional application No. 62/984,816, filed on Mar. 4, 2020.

(51) Int. Cl.
*H05K 7/20* (2006.01)
*F28F 13/00* (2006.01)
*G02B 6/42* (2006.01)
*H01R 13/514* (2006.01)

(52) U.S. Cl.
CPC ......... *H05K 7/20636* (2013.01); *F28F 13/00* (2013.01); *G02B 6/4269* (2013.01); *G02B 6/4278* (2013.01); *H01R 13/514* (2013.01); *H05K 7/20254* (2013.01)

(58) Field of Classification Search
CPC .......... H05K 7/20254; H05K 7/20218; H05K 7/20263; H05K 7/20645; G02B 6/4266–4273
See application file for complete search history.

(56) References Cited

U.S. PATENT DOCUMENTS

| | | | |
|---|---|---|---|
| 6,427,449 B1 * | 8/2002 | Logan | F28F 3/12 62/3.4 |
| 7,113,399 B2 * | 9/2006 | Hisano | H05K 7/20254 361/688 |
| 9,453,972 B1 | 9/2016 | Arvelo et al. | |
| 9,562,728 B2 * | 2/2017 | Gotou | H01L 23/473 |
| 9,910,231 B2 | 3/2018 | Kelty et al. | |
| 10,104,760 B1 | 10/2018 | Briant et al. | |
| 10,178,804 B2 | 1/2019 | Sharf et al. | |

(Continued)

OTHER PUBLICATIONS

International Search Report and Written Opinion in counterpart International Application No. PCT/US2021/019593, dated Jun. 9, 2021, 16 pages.

*Primary Examiner* — Zachary Pape
(74) *Attorney, Agent, or Firm* — Edell, Shapiro & Finnan, LLC

(57) ABSTRACT

Presented herein is a plurality of arrangements of cold plates having interior chambers. The interior chamber includes a plurality of fins with a first fin zone and a second fin zone. The cold plate further includes a first fluid inlet and a first fluid outlet. The cold plates can be connected such that each cold plate allows unidirectional flow or counter flow configurations. Unidirectional flow or counter flow cold plates can be arranged in rows and in combination of rows.

20 Claims, 12 Drawing Sheets

(56) References Cited

U.S. PATENT DOCUMENTS

| | | | |
|---|---|---|---|
| 10,249,983 B2 | 4/2019 | Regnier et al. | |
| 10,617,035 B2* | 4/2020 | Mayberry | B22F 5/00 |
| 10,827,649 B2* | 11/2020 | Lunsman | H05K 7/20927 |
| 11,112,189 B2* | 9/2021 | Nakano | F28F 3/048 |
| 2013/0068433 A1* | 3/2013 | Muthigi | F28F 21/08 |
| | | | 165/181 |
| 2014/0339693 A1* | 11/2014 | Hotta | H01L 27/0629 |
| | | | 257/714 |
| 2015/0077937 A1* | 3/2015 | Daly | G02B 6/428 |
| | | | 361/700 |
| 2016/0192534 A1 | 6/2016 | Pons et al. | |
| 2017/0269314 A1* | 9/2017 | Gaal | H05K 7/20563 |
| 2019/0226765 A1* | 7/2019 | Xu | F25J 3/04218 |
| 2019/0246523 A1* | 8/2019 | Boyden | H05K 7/2049 |
| 2019/0288353 A1* | 9/2019 | Harris | H01M 10/6556 |
| 2020/0006884 A1 | 1/2020 | Weltsch et al. | |
| 2020/0229321 A1* | 7/2020 | Dogruoz | G02B 6/4278 |

\* cited by examiner

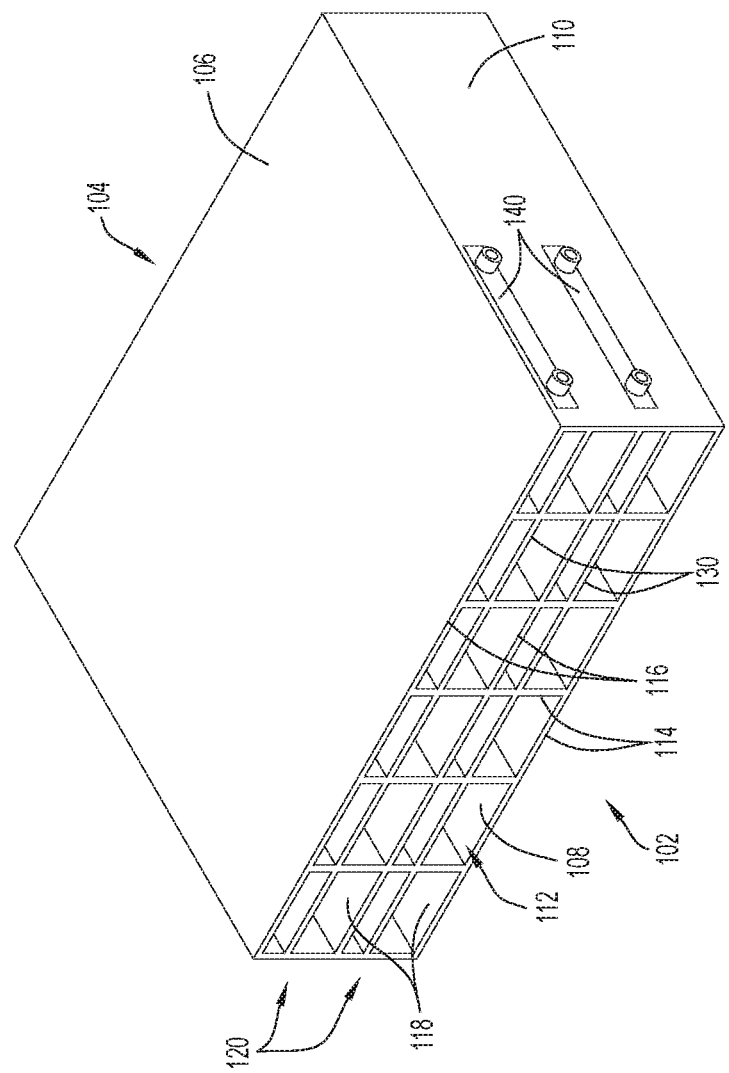

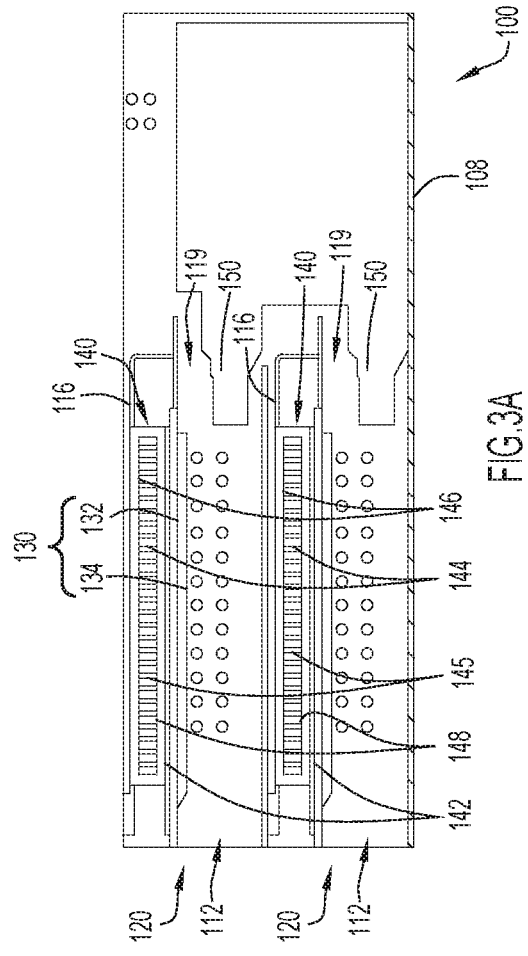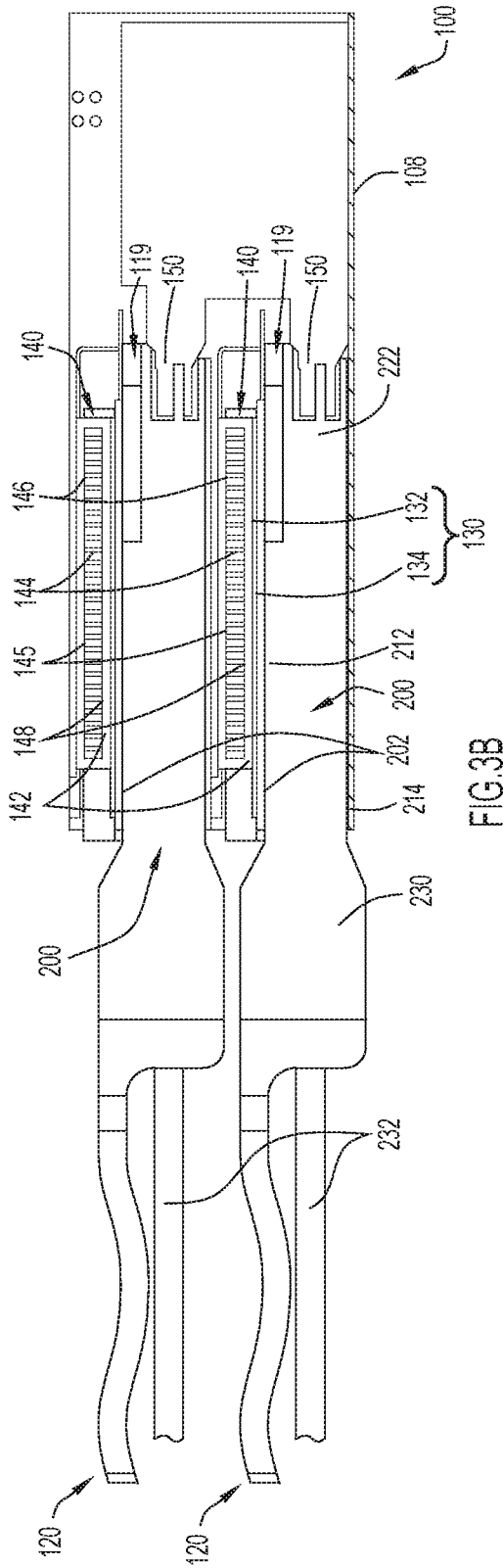

THERMAL MANAGEMENT OF HIGH CAPACITY OPTICS IN DENSE ARRANGEMENTS

CROSS-REFERENCE TO RELATED APPLICATION

This application claims priority to U.S. Provisional Application No. 62/984,816, filed Mar. 4, 2020, the entirety of which is incorporated herein by reference.

TECHNICAL FIELD

The present disclosure relates to thermal management of electronic equipment/devices, and more specifically, to cold plates and their arrangements for dissipating heat from a heat source.

BACKGROUND

Networking and other electronic equipment are getting smaller or remaining the same size, but with higher performance or with newer capabilities, such as new networking standards, imposed on the equipment. One challenge is to keep operating temperature of devices below their allowable limits. Overheating of equipment can contribute to failures.

BRIEF DESCRIPTION OF THE DRAWINGS

FIG. 1B is a perspective view of the enclosure of FIG. 1A.

FIG. 3A a cross-sectional side view of the enclosure of FIGS. 1A and 1B with heatsink interfaces and cold plates installed, according to an example embodiment.

FIG. 3B is a cross-sectional side view of the enclosure of FIGS. 1A and 1B with pluggable modules received in the ports, according to an example embodiment.

DESCRIPTION OF EXAMPLE EMBODIMENTS

Overview

Figure 1A:
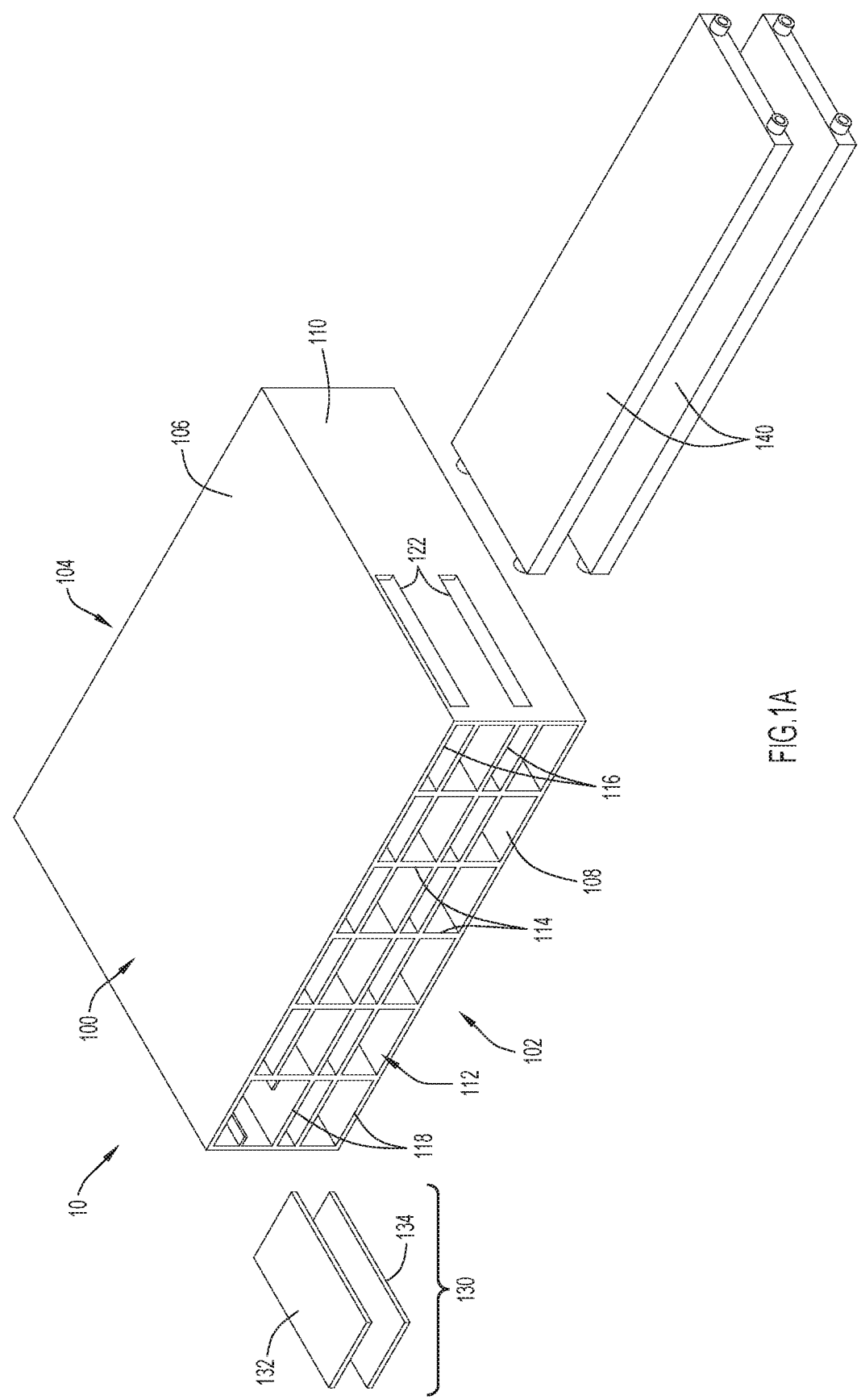
FIG. 1A is an exploded view of an enclosure according to an example embodiment.

In one embodiment, a system for cooling an enclosure, e.g., a module housing, is presented. The system includes a cage housing and a plurality of plates disposed within the cage housing. Each plate includes an interior chamber, a first fluid inlet, and a first fluid outlet. The interior chamber includes a first fin zone, a second fin zone, and a plurality of fins disposed in the first fin zone and the second fin zone.

In one embodiment, a method for cooling pluggable modules received in a cage is presented. The method includes directing a flow of fluid to an inlet of a cold plate arrangement, flowing the fluid through a first plurality of fin groups, wherein a first fin-density of each fin group of the first plurality of fin groups corresponds to a first heat source. The method further includes flowing the fluid through a second plurality of fin groups, wherein a second fin-density of each fin group of the second plurality of fin groups corresponds to a second heat source that differs from the first heat source. The method further includes flowing the fluid through an outlet of the cold plate arrangement.

In one embodiment, a cold plate having an interior chamber is presented. The interior chamber includes a first fin zone and a second fin zone. A plurality of fins is disposed in the first fin zone and the second fin zone. The cold plate further includes a first fluid inlet and a first fluid outlet.

Example Embodiments

Presented herein is a highly scalable/stackable liquid cooled system with bi-directional cold plates integrated to optical cages comprising high power (for example, Quad Small Form Factor Pluggable Double Density (QSFP-DD) 400 G and 800 G) optical modules. These optical cage arrangements/configurations achieve proper thermal management of high-density optic modules whose total power output can be significant.

Next generation optical network equipment may include pluggable optical transceiver modules, such as high power coherent optical modules at 400 G or above for which thermal management devices are important. While the form factor of the pluggable modules may be the same, the desired port density on the line card keeps increasing. For example, exceeding the typical 32 or 36 ports per 1 Rack Unit (RU) may be desirable.

Trends in module power dissipation well-exceed that shown by Moore's Law. Some variants of a 400 G QSFP-DD form factor module using 56 Gbps electrical input/output (I/O) are estimated to dissipate up to 22 W of power or more. Higher speed modules may use 112 Gbps electrical I/O and could dissipate even more power.

Having a much higher density of pluggable modules in a system design (for example, 40 QSFP-DD ports in a 1 RU or 100 QSFP-DD ports in a 2 RU line card/chassis) is highly desired. To fit these ports on a line card/chassis with less than 17.3" total width, multiple rows of cages may be used with various cage arrangements and the total cage assembly height including heat exchanger may be less than 16 mm. Even aggressive non-traditional air-cooling methods may be inadequate to cool high density modules at approaching air temperatures higher than 25-30 degrees Celsius (deg C.). However, it is still desirable to have network equipment operable at up to 40 deg C. ambient air.

Examples of pluggable optical module powers and system densities are referenced herein to describe the concepts but the approach is adaptable to alternative configurations. Thermal management of high power optics up to 30 W for each module in a line card, which results in a total optics power output of 1200 W in 1 RU, or 3000 W in 2 RU, may be achieved. For such, liquid cooling may be favorable, as it has superior thermophysical properties and delivers higher thermal performance while demanding a reduced amount of pumping power as compared to air-cooling.

Presented herein are configurations for a low profile (in terms of height) cages integrated with cold plates having variable fin densities and versatile bi-directional flow (e.g., parallel and counter flow configurations). These configurations provide for a highly scalable/stackable liquid cooling arrangement that maximizes port density and provides proper cooling to high-density pluggable modules, e.g., 1200 W capacity optics in a 1-RU and/or 3000 W capacity optics in a 2 RU form factor. The same concepts may be applied to other form factors and configurations.

With reference made to FIGS. 1A-1B, a system 10 for cooling one or more pluggable modules is shown. The system 10 includes an enclosure 100, or ganged stacked cage, and cold plate 140. The enclosure 100 includes a front end 102, rear end 104, a top panel 106, bottom panel 108, and a side panel 110. As shown in FIGS. 1A and 1B, the enclosure 100 further includes ports 112, or plug receptacles. Each port 112 can be defined by port sidewalls 114, a port top 116, and a port bottom 118. While FIGS. 1A and 1B show a 2×6 ganged stacked cage having two stacked rows 120 of six ports 112, embodiments are not limited thereto. The enclosure 100 may have any number of ports 112 in any arrangement. For example, the enclosure 100 may comprise X rows 120 of Y ports 112, wherein "X" and "Y" are positive integers. For example, the enclosure 100 may include a single port 112 (e.g., one row 120 having one port 112); two vertically stacked rows, each row 120 comprising six ports 112; or five vertically stacked rows, each row 120 comprising 20 ports 112. Additionally, or alternatively, a corresponding cold plate 140 may extend across each row 120.

A heatsink interface 130 having a recoverable material 132 and riding contact plate 134 may be disposed in each port 112. The recoverable material 132 may be heat conducting and deformable, durable, and compressible, e.g., a thermal interface material (TIM), a recoverable foam, etc. The side panel 110 of the enclosure 100 includes openings 122 for receiving cold plates 140. As shown in FIG. 1B, the cold plates 140 extend through the upper portions of each port 112, e.g., the cold plates 140 may engage the recoverable material 132 of each of the heatsink interfaces 130. While the heatsink interfaces 130 are shown disposed near an upper portion of the ports 112, (e.g., closer to the port top 116 than the port bottom 118) the heatsink interfaces 130 may be disposed at other portions of the ports 112. For example, the heatsink interfaces 130 may be disposed at a lower portion of the ports 112 (e.g., closer to the port bottom 118 than the port top 116). Further, the heatsink interfaces 130 may be oriented such that the recoverable material 132 of each heatsink interface 130 is disposed between cold plate 140 and its respective riding contact plate 134. Alternatively, or additionally, the heatsink interfaces 130 may extend across one or more ports 112 in a row 120. That is the heatsink interfaces 130 may correspond with one or more ports 112, or all of the ports 112, in a row 120.

Figure 1C:
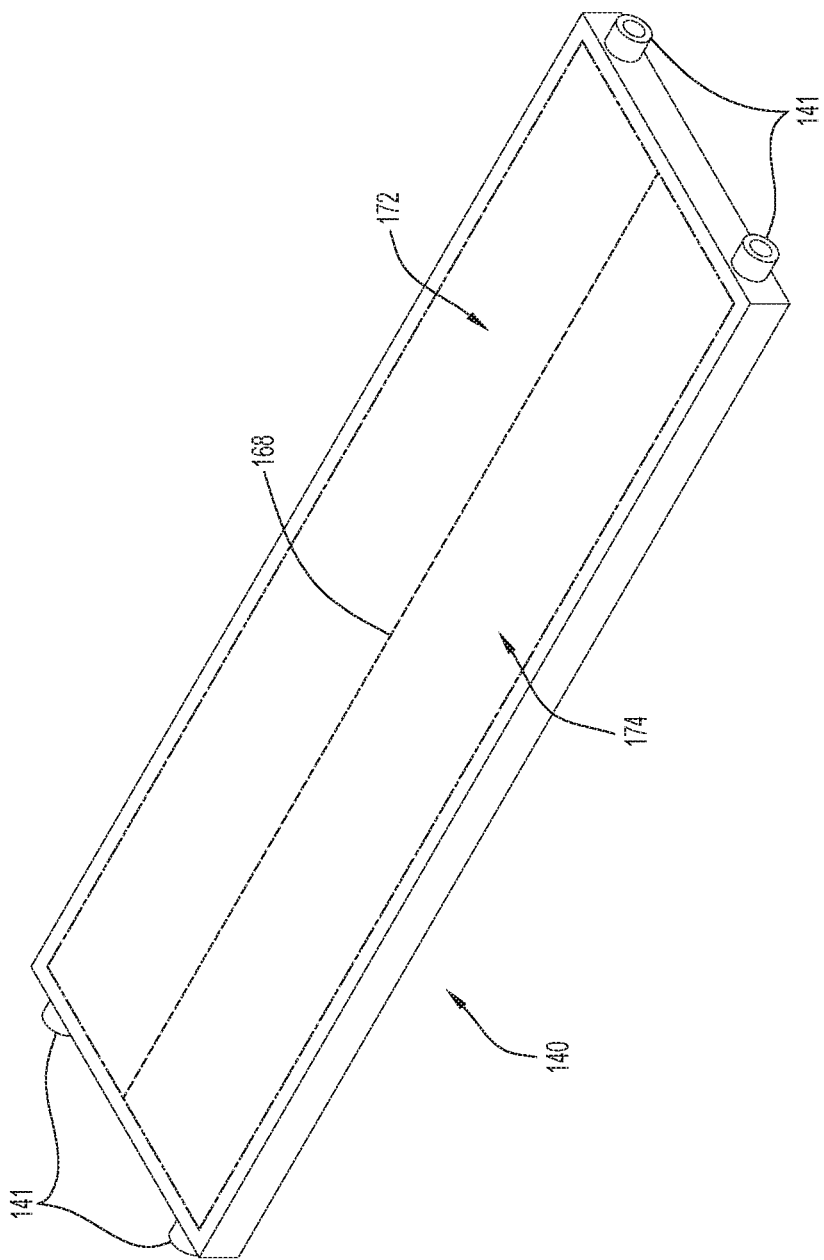
FIG. 1C is a perspective view of a cold plate of the enclosure of FIG. 1A.

With reference to FIG. 1C, a perspective view of a cold plate 140 is shown. Cold plate 140 includes fluid ports 141 in fluid communication with an interior chamber for receiving a flow of cooling fluid. A plurality of fin groups as further detailed below in FIGS. 3A, 3B, 4B, and 5B, may be disposed in the chamber. The fluid ports 141 may be used as a fluid inlet and/or fluid outlet to the chamber. The chamber may be divided into a first fin-density zone 172 and a second fin-density zone 174. The first fin-density zone 172 and second fin-density zone 174 may be separated by a fluid barrier or separator 168. Two fluid ports 141 may correspond to each fin-density group. For example, two fluid ports 141 may be in fluid communication with the first fin-density zone 172, and two fluid ports 141 may be in fluid communication with the second fin-density zone 174. In some implementations, the ports 141 may be representative of one or more fluid inlets 442, 442', 542, 542' and/or one or more fluid outlets 444, 444', 544, 544' described below with reference to FIGS. 4A-5B. For example, the ports 141 and fin-density zones 172, 174 of the cold plate 140 may be configured in a unidirectional flow arrangement—e.g., guiding two or more flows fluid through the cold plate 140 in the same direction (described below with reference FIGS. 4A and 4B) or a counter flow arrangement—e.g., guiding two or more flows of fluid through the cold plate 140 in opposite directions (described below with reference to FIGS. 5A and 5B).

Figure 2:
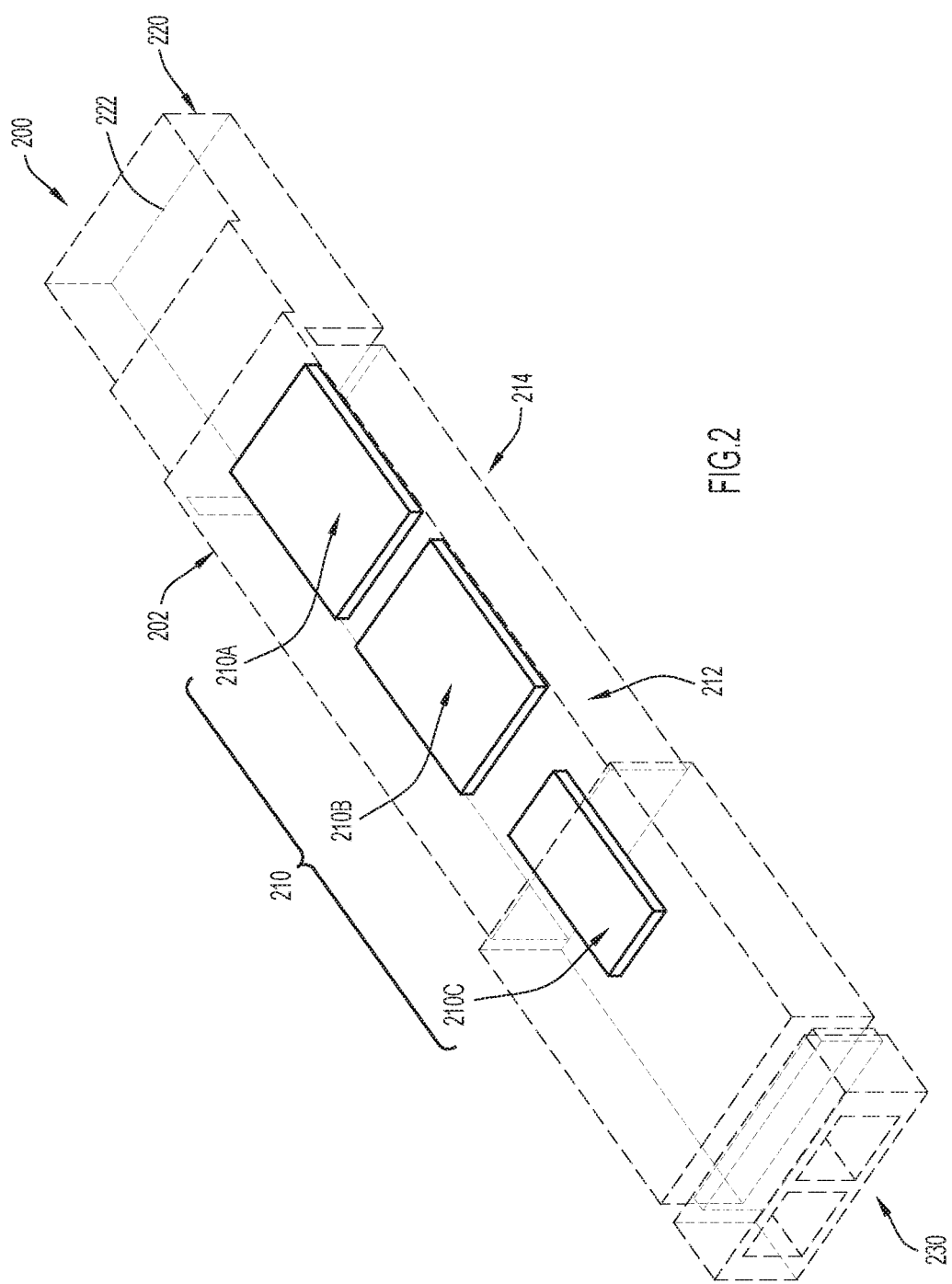
FIG. 2 is a perspective view of a pluggable module, according to an example embodiment.

Referring FIG. 2, a pluggable module 200 is illustrated. The pluggable module 200 can include a distal end 220 and a proximal end 230. The pluggable module 200 can further include an electrical connector 222 disposed at the distal end 220 and one or more heat sources 210A, 210B, 210C, collectively represented as 210, disposed at a heat source portion 212 of the pluggable module 200, which is between the distal end 220 and the proximal end 230. The heat source portion 212 may be opposite a belly portion 214 of the pluggable module 200. For example, the pluggable module 200 may be a QSFP-DD optical module and each heat source 210A, 210B, 210C may be a circuit chip which generates heat. The heat generated by the chips may be based on the power budgets for each chip. For example, heat source 210A (e.g., a chip) may have a power budget of a first wattage, heat source 210B may have a power budget of a second wattage, and heat source 210C may have a power budget of a third wattage. The first wattage of heat source 210A may correspond to a first amount of heat, the second wattage of heat source 210B may correspond to a second amount of heat, and the third wattage of heat source 210C may correspond to a third amount of heat. Accordingly, the pluggable module 200 may produce a total of heat equal to the sum of the first, second, and third amounts of heat, as an example. Each heat source may have any desired power budget. In some implementations, the power budgets may vary across the three heat sources. In some implementations, heat sources disposed closer the distal end 220 of the pluggable module 200 may dissipate more heat than heat sources closer to the proximal end 230.

FIGS. 3A and 3B are cross-sectional side views of the enclosure 100 of FIGS. 1A and 1B. FIG. 3A illustrates a cross-sectional side view of the enclosure 100 with heatsink interface 130 and cold plate 140 installed without a pluggable module 200 received in the ports 112. Cold plates 140 extend along the rows 120 of ports 112 at the port tops 116. Each plate 140 includes a plurality of fins 144 extending from a first interior surface 146 to a second interior surface 148 of an interior chamber 145 of the cold plate 140. Fins 144 may have a plurality of thicknesses, pitches and densities within the cross-section on a single or both sides of the separator 168 depicted in FIG. 1C. Each port 112 includes a heatsink interface 130 which engages a contact surface 142 of the cold plate 140. The recoverable material 132 directly contacts the contact surface 142 of the cold plate 140. Each port 112 further includes an electrical connector 150 located at a rear end 119 of the port 112. The electrical connector 150 can be configured to electrically couple with an electrical connector 222 of a pluggable module 200, which is best illustrated in FIG. 3B.

FIG. 3B illustrates a cross-sectional side view of the enclosure 100 with pluggable modules 200 received in the ports 112. Each heatsink interface 130 is disposed between a contact surface 142 of a cold plate 140 and a contact surface 202 of the pluggable module 200. The electrical connector 222 of the pluggable module 200 may engage and may be electrically coupled to the electrical connector 150 of the port 112. For example, the pluggable module 200 may be a QSFP-DD optical module with heat sources, or circuit chips, 210A, 210B, 210C. The module 200 may receive an optical signal from an optical cable 232 and convert the optical signal into an electrical signal output to the electrical connector 222 via one or more of the circuit chips 210A, 210B, 210C that serve as heat sources, and are thus hereinafter referred to as heat sources 210A, 210B and 210C. The electrical connector 150 of the port 112 may receive the electrical signal from electrical connector 222. The heat sources 210A, 210B, 210C may generate heat during the conversion process. As noted above with reference to FIG. 2, the heat generated by the heat sources 210A, 210B, 210C may be based on the power budget for each chip.

The heat from the heat sources 210A, 210B, 210C may be transferred from the pluggable module 200 through the heatsink interface 130 to the cold plate 140. The heatsink interface 130 may maintain contact and a continuous thermal path between the cold plate 140 and the pluggable module 200. For example, the recoverable material 132 may bias the riding contact plate 134 towards the contact surface 202 of the pluggable module 200. That is, the recoverable material 132 may exert a force onto the riding contact plate 134 thereby pushing the riding contact plate 134 into contact with the contact surface 202 of the pluggable module 200. Heat may be transferred from the pluggable module 200 through the riding plate 134 and the recoverable material 132 to the cold plate 140. The plurality of fins 144 of the cold plate 140 may transfer the heat to a cooling fluid flowing through the cold plate 140.

Figure 4A:
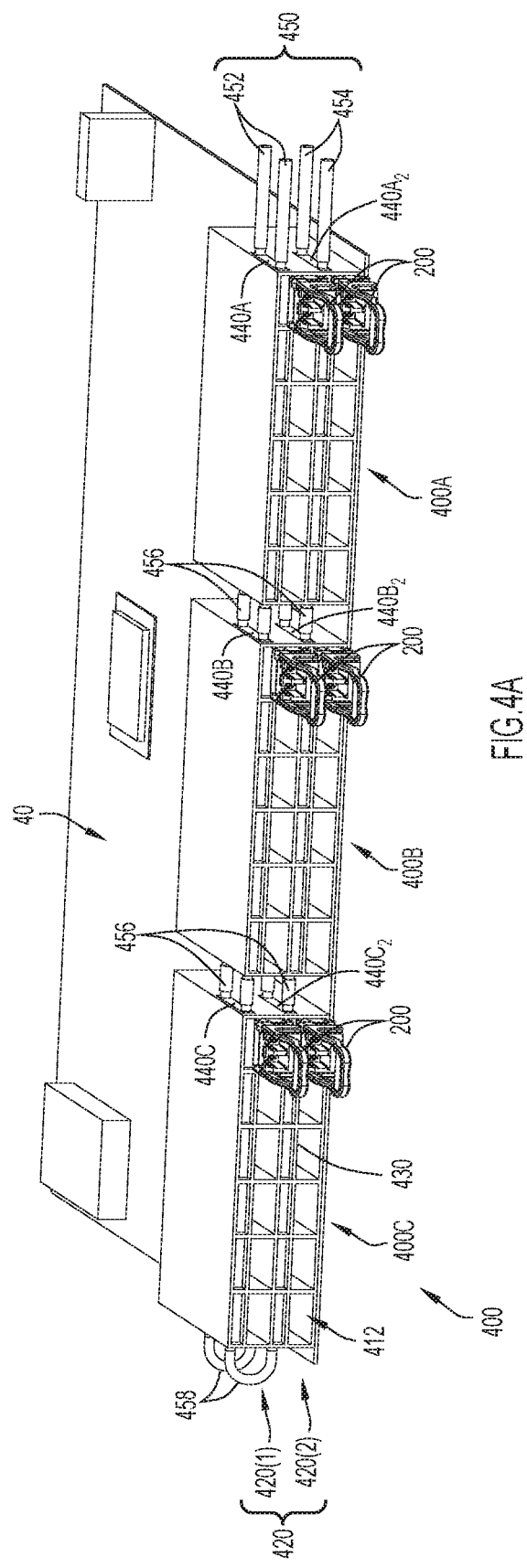
FIG. 4A is a perspective view of a line card having enclosures with cold plates, according to an example embodiment.

Referring to FIG. 4A, a line card 40 is shown. The line card 40 includes as system for cooling three (3) enclosures 400A, 400B, 400C, collectively referred to as 400, with cold plate arrangements having a unidirectional flow configuration. Each of the enclosures 400A, 400B, 400C may be representative of the enclosure 100 of FIGS. 1A and 1B. Each enclosure 400A, 400B, 400C, can include one or more rows 420 of one or more ports 412, one or more heatsink interfaces 430. For example, the one or more rows may include a first row 420(1) and a second row 420(2). The one or more ports 412 can each receive a pluggable module 200. Furthermore, enclosure 400A may include a cold plate arrangement having cold plates 440A, 440A$_2$; enclosure 400B may include a cold plate arrangement having cold plates 440B, 440B$_2$; and enclosure 400C may include a cold plate arrangement having cold plates 440C, 440C$_2$. Each of the cold plates 440A, 440A$_2$, 440B, 440B$_2$, 440C, 440C$_2$, collectively referred to as 440, may be representative of the cold plate 140 of FIG. 1C.

As noted above with reference to FIG. 3B, heat from one or more heat sources 210A, 210B, 210C of a pluggable module 200 may be transferred through a corresponding heatsink interface 430 to the corresponding cold plate 440A, 440A$_2$, 440B, 440B$_2$, 440C, 440C$_2$. Cooling fluid may flow through the cold plates to dissipate the heat transferred to the corresponding cold (cooling) plate 440A, 440A$_2$, 440B, 440B$_2$, 440C, 440C$_2$. The cooling fluid may flow through each cold plate 440A, 440B, 440C, 440A$_2$, 440B$_2$, 440C$_2$ in series. For example, the cooling fluid may flow from a cooling fluid source through cold plate 440A, cold plate 440B, cold plate 440C, cold plate 440C$_2$, cold plate 440B$_2$, cold plate 440A$_2$, and then returned to the fluid source.

For example, fluid lines 450 direct a flow of cooling fluid through each cold plate 440A, 440A$_2$, 440B, 440B$_2$, 440C, 440C$_2$ in series, as described above. That is, cooling fluid may be supplied from a fluid source to a cold plate 440A. When flowing in series, the cooling fluid may flow through cold plate 440A, cold plate 440B, cold plate 440C, cold plate 440C$_2$, cold plate 440B$_2$, and cold plate 440A$_2$ before returning to the fluid source. For example, as previously explained in FIG. 1C, each cold plate 440A, 440A$_2$, 440B, 440B$_2$, 440C, 440C$_2$ may have one or more fluid inlets and fluid outlets. Fluid lines 450 may include one or more supply lines 452 for supplying cooling fluid from the fluid source and one or more a return lines 454 for returning cooling fluid back to the fluid source. In some implementations, a first row of cold plates 440A, 440B, 440C may be fluidly coupled via enclosure transfer lines 456. In some implementations, a second row of cold plates 440A$_2$, 440B$_2$, 440C$_2$ may also be fluidly coupled via enclosure transfer lines 456. In some implementations, the first row of cold plates 440A, 440B, 440C may be fluidly coupled to the second row of cold plates 440A$_2$, 440B$_2$, 440C$_2$ via row transfer lines 458. That is, a row transfer line 458 may fluidly couple an outlet of cold plate 440C to an inlet of cold plate 440C$_2$. Thus, a flow of cooling fluid may flow through cold plates 440A, 440B, 440C and enclosure transfer lines 456 between cold plates 440A, 440B, 440C, through row transfer lines 458, and through cold plates 440C$_2$, 440B$_2$, and 440A$_2$ and enclosure transfer lines 456 between cold plates 440C$_2$, 440B$_2$, and 440A$_2$.

For example, FIG. 4A shows two fluid supply lines 452 connected to cold plate 440A and two fluid return lines 454 connected to cold plate 440A$_2$ of enclosure 400A. Enclosure transfer lines 456 may further connect the fluid outlets of cold plate 440A to the fluid inlets of cold plate 440B, and the fluid outlets of cold plate 440B to the fluid inlets of cold plate 440C. Row transfer lines 458 may further connect the fluid outlets of cold plate 440C to the fluid inlets of cold plate 440C$_2$. Enclosure transfer lines 456 may connect the fluid outlets of cold plate 440C$_2$ to the fluid inlets of cold plate 440B$_2$, and the fluid outlets of cold plate 440B$_2$ to the fluid inlets of cold plate 440A$_2$.

In some implementations, each enclosure 400A, 400B, 400C may have separate fluid supply lines 452 and fluid return lines 454 for directing fluid to respective cold plates in each enclosure. For example, cooling fluid may be directed to cold plate 440A of enclosure 400A. The cooling fluid may flow through cold plate 440A to cold plate 440A$_2$ and then back to the fluid source via fluid return lines. A second set of fluid supply lines (not shown) may provide cooling fluid to cold plate 440B of enclosure 400B. The cooling fluid may flow through cold plate 440B to cold plate 440B$_2$, and then back to the fluid source via a second set of fluid return lines (not shown). A third set of fluid supply lines (not shown) may provide cooling fluid to cold plate 440C of enclosure 400C. The cooling fluid may flow through cold plate 440C to cold plate 440C$_2$, and then back to the fluid source via a third set of fluid return lines (not shown). In some implementations, the cooling fluid is a dielectric liquid.

Figure 4B:
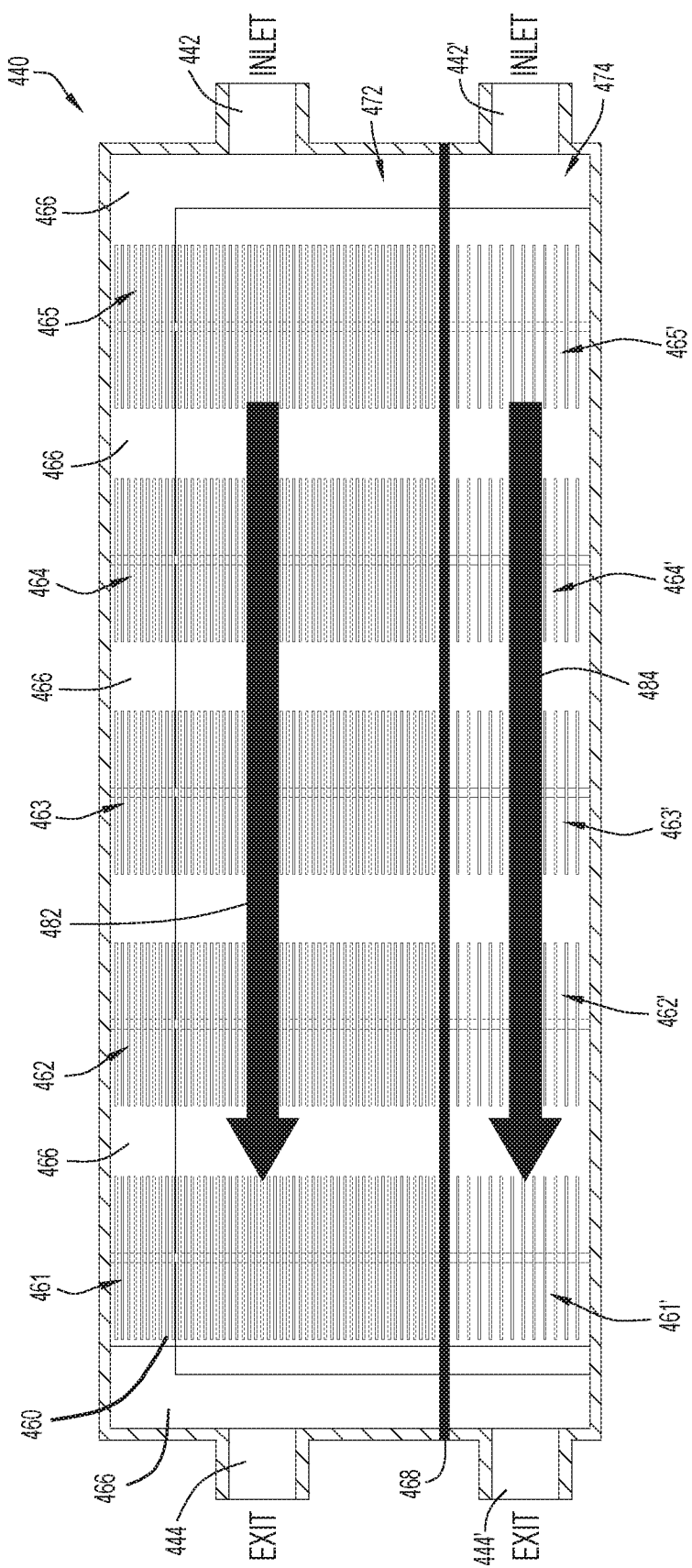
FIG. 4B a cross-sectional top view of a parallel flow cold plate of FIG. 4A.

With reference to FIG. 4B, a cross-sectional top view of a cold plate 440 of FIG. 4A is shown. Cold plate 440 may be representative of cold plate 440A, cold plate 440B, cold plate 440C of FIG. 4A, and may be a mirror representation of cold plates 440A$_2$, 440B$_2$, 440C$_2$. The cold plate 440 includes fluid inlets 442, 442', fluid outlets 444, 444', a plurality of fins 460, and a fluid barrier 468. The plurality of fins 460 may be grouped into fin groups 461, 461', 462, 462', 463, 463', 464, 464' 465, 465'. Each of the fin groups 461, 461', 462, 462', 463, 463', 464, 464' 465, 465' may be separated from one another by gaps 466. The fin groups 461, 461', 462, 462', 463, 463', 464, 464' 465, 465' may be configured to vertically align with one or more heatsink interfaces 130 and one or more of the heat sources (e.g., heat sources 210A, 210B, 210C) of a corresponding pluggable module 200. Gaps 466 may be disposed between adjacent fin groups 461, 461', 462, 462', 463, 463', 464, 464' 465, 465' such that the gaps 466 are vertically aligned where the heat sources 210A, 210B, 210C from pluggable modules 200 are not present (e.g., generally where the port sidewalls 114 of the ports 112 are present).

Each fin group 461, 461', 462, 462', 463, 463', 464, 464' 465, 465' may have a variable fin-density. The fin-density of a fin group may be representative of a thickness of the fins within the group, a distance between each fin within the group, and/or number of fins within the group. The fin-density of each group may be predetermined based on a power budget of the one or more heat sources 210A, 210B, 210C of the corresponding pluggable module 200. For example, each fin group 461, 461', 462, 462', 463, 463', 464, 464' 465, 465' may have a predetermined fin-density that correspond to one or more heat sources 210A, 210B, 210C of a pluggable module 200 that may be in thermal contact with the cold plate 440 and vertically aligned with the fin group 461, 461', 462, 462', 463, 463', 464, 464' 465, 465'.

In some implementations, two fin groups may correspond to the same pluggable module 200. For example, fin group 461 may correspond to heat sources 210A and 210B of a pluggable module 200 and fin group 461' may correspond to heat sources 210C of pluggable module 200. Fin groups 462 and 462' may correspond to another set of heat sources of another pluggable module that is in thermal contact with the cold plate 440 and vertically aligned with the fin groups 462 and 462'.

In some implementations, a fin-density of one fin group may have a different fin-density than another fin group. For example, fin group 461 may have a different fin-density as compared to a fin-density of fin groups 461', 462, 462', 463, 463', 464, 464', 465, and/or 465'.

In some implementations, fin groups 461, 462, 463, 464, and 465, may have a first fin-density and fin groups 461', 462', 463', 464', 465' may have a second fin-density. For example, a first plurality of fin groups 461, 462, 463, 464, 465 may be disposed in a high fin-density zone 472 of the cold plate 440, and a second plurality of fin groups 461', 462', 463', 464', 465' may be disposed in a low fin-density zone 474. That is, the first plurality of fin groups 461, 462, 463, 464, 465 may have higher fin-densities as compared to fin-densities of the second plurality of fin groups 461', 462', 463', 464', 465'. The high fin-density zone 472 may correspond to high heat flux components of a module 200 (e.g., heat source 210A, 210B, and/or 210C), and the low fin-density zone 474 may correspond to low heat flux components of the module 200 (e.g., heat source 210A, 210B, and/or 210C). That is, when the module 200 is received in an enclosure 400, high heat flux components of the module 200 may be disposed adjacent to and thermally coupled to the high fin-density zone 472, and low heat flux components of the module 200 may be disposed adjacent to and thermally coupled to the low fin-density zone 474.

The high fin-density zone 472 may be separated from the low fin-density zone 474 by the fluid barrier 468. Further, the high fin-density zone 472 and the low fin-density zone 474 of the cold plate 440 may have separate fluid inlets 442, 442' and fluid outlets 444, 444'. That is, fluid inlet 442 and fluid outlet 444 may correspond to the high fin-density zone 472, and fluid inlet 442' and fluid outlet 444' may correspond to the low fin-density zone 474. The fluid supply lines 452, enclosure transfer lines 456, and/or row transfer lines 458 may supply cooling fluid to the cold plate 440 via fluid inlets 442, 442' depending on where the cold plate 440 is placed in the cold plate arrangement (e.g., as shown in FIG. 4A). Referring back to FIG. 4B, arrows illustrate a direction of flow of the cooling fluid. Flows of cooling fluid 482, 484 unidirectionally flow through the fin-density zones 472, 474, respectively, to the fluid outlets 444, 444', respectively. The flows of cooling fluid 482, 484 pass through the plurality of fins 460. Heat can be transferred from the plurality of fins 460 to the flows of cooling fluid 482, 484. The flows of cooling fluid 482, 484 can continue to the next cold plate 440 in the cold plate arrangement via the enclosure transfer lines 456 and/or the row transfer lines 458 or to the fluid source via fluid return lines 454 (e.g., as shown in FIG. 4A). Thus, the flows of cooling fluid 482, 484 flow through a series of cold plates (e.g., through cold plate 440A and then through cold plate 440A$_2$; or through cold plate 440A, cold plate 440B, cold plate 440C, cold plate 440C$_2$, cold plate 440B$_2$, and then to cold plate 440A$_2$; etc.).

In some implementations, the cold plate 440 may include more than two fin-density zones. For example, the cold plate 440 may include high, low, and intermediate fin-density zones, each zone having a corresponding fluid inlet and fluid outlet. That is, the cold plate 440 may have three fin-density zones having different fin densities separated by two fluid barriers, three fluid inlets and three fluid outlets. In some implementations, a cold plate 440 may have a single inlet, as single outlet, and a single flow of cooling fluid through a cold plate 440 with no fluid barriers between fin groups. However, the number of fin-density zones, fluid barriers, inlets and outlets for a cold plate may be determined based on the power budgets of one or more corresponding heat sources of one or more pluggable modules 200.

Figure 5A:
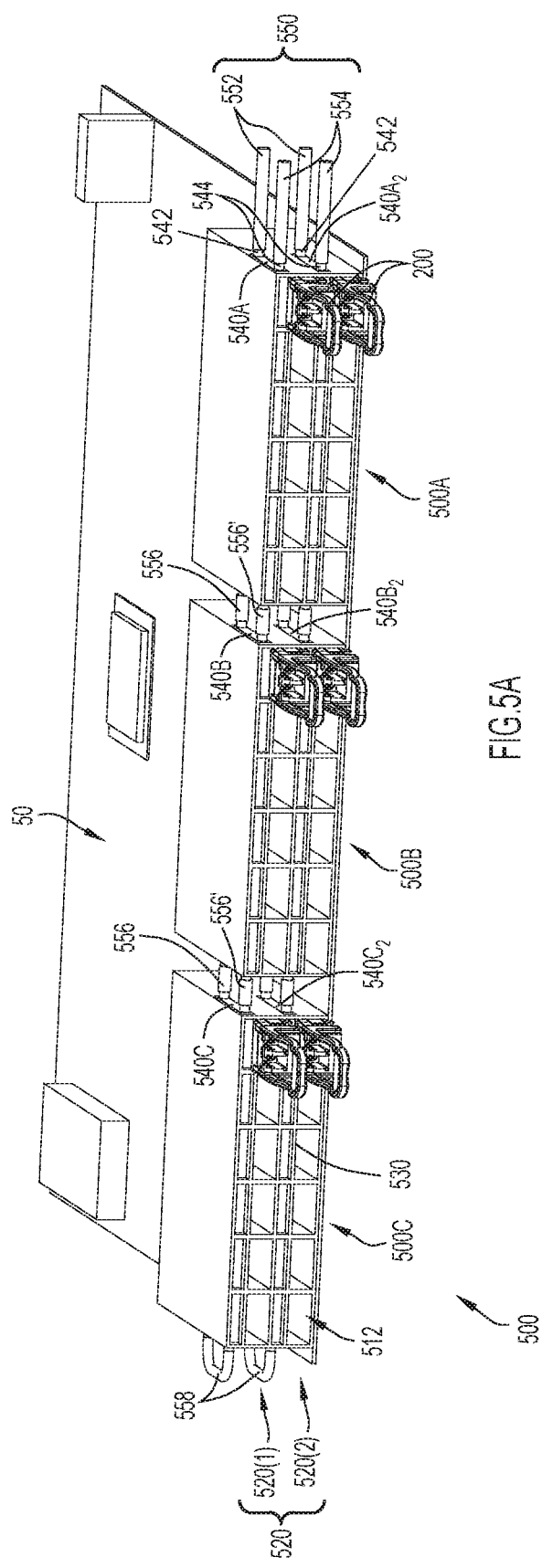
FIG. 5A is a perspective view of a line card having enclosures with cold plates, according to an example embodiment.
Figure 5B:
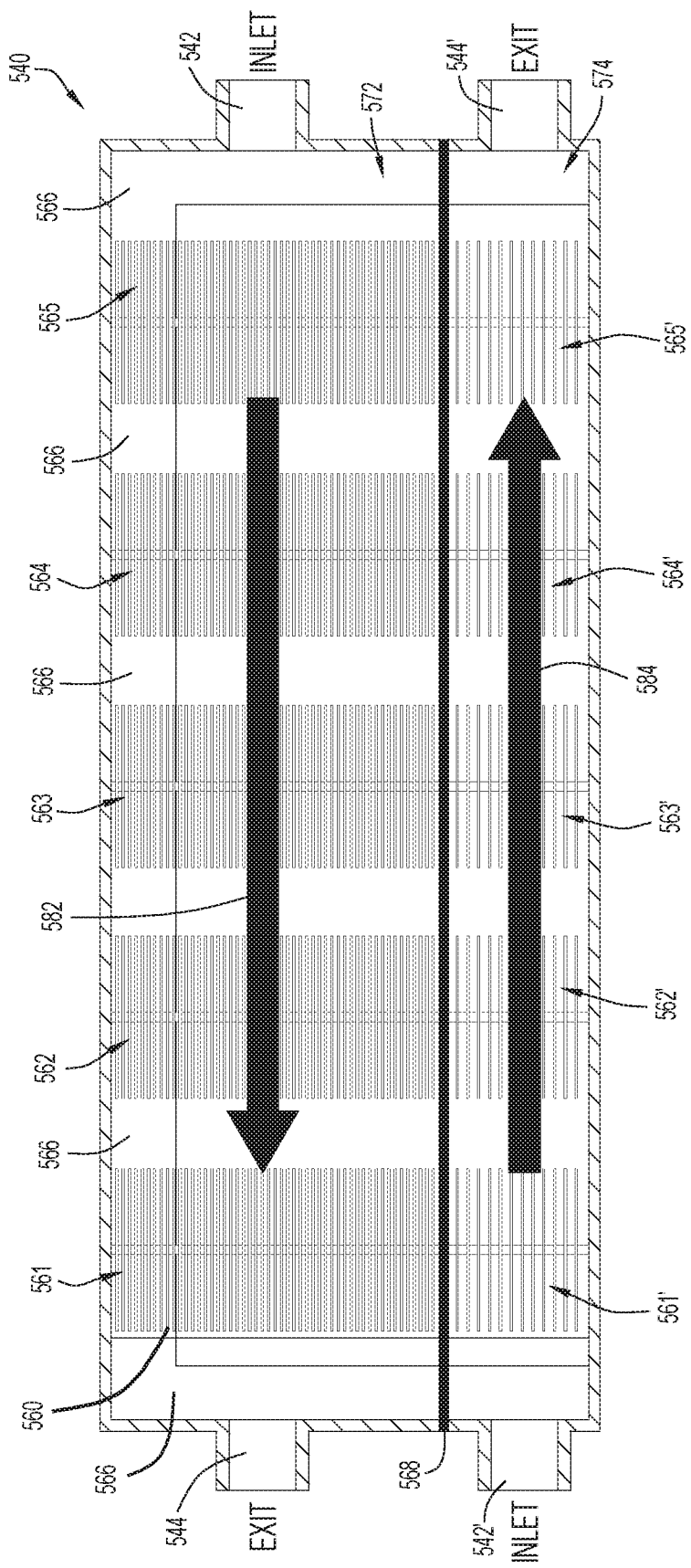
FIG. 5B a cross-sectional top view of a counter flow cold plate of FIG. 5A.

Referring to FIG. 5A, a line card 50 is shown according to an embodiment. The line card 50 includes as system for cooling three (3) enclosures 500A, 500B, 500C, collectively referred to as 500, with a parallel cage cooling fluid flow arrangement that utilizes a counter flow through the cold plates 540A, 540A$_2$, 540B, 540B$_2$, 540C, 540C$_2$, collectively referred to as 540. Each of the enclosures 500A, 500B, 500C may be representative of the enclosure 100 of FIGS. 1A and 1B. Each enclosure 500A, 500B, 500C, can include one or more rows 520 of one or more ports 512, one or more heatsink interfaces 530, and an arrangement of one or more cold plates 540A, 540A$_2$, 540B, 540B$_2$, 540C, 540C$_2$. The one or more ports 512 can each receive a pluggable module 200. Each of the cold plates 540A, 540A$_2$, 540B, 540B$_2$, 540C, 540C$_2$ may be representative of the cold plate 140 of FIG. 1C, and further represented by the cold plate 540 illustrated in FIG. 5B, such that the chamber of each cold plate 540A, 540A$_2$, 540B, 540B$_2$, 540C, 540C$_2$ may be partitioned into a high or first fin-density zone 572 and a low or second fin-density zone 574 by a fluid barrier 568 as shown in FIG. 5B. Each fin-density zone may have separate fluid inlets 542 and fluid outlets 544. That is, a first fluid inlet 542 and a first fluid outlet 544 may correspond to the high fin-density zone 572 of each cold plate 540, and a second fluid inlet 542' and a second fluid outlet 544' may correspond to the low fin-density zone 574 of each cold plate 540.

Referring back to FIG. 5A, fluid lines 550 direct flows of cooling fluid through each cold plate 540 in each row 520. Fluid lines 550 may include one or more supply lines 552 for supplying a flow of cooling fluid from a fluid source and one or more return lines 554 for returning cooling fluid back to the fluid source. That is, a first flow of cooling fluid may flow through cold plates 540A, 540B, 540C of a first row 520(1), while a second flow of cooling fluid may flow through a cold plates $540A_2$, $540B_2$, $540C_2$ of a second row 520(2). In some implementations, the high fin-density zones of the cold plates 540A, 540B, 540C located in the first row 520(1) may be fluidly coupled via enclosure transfer lines 556, while the low fin-density zones of the cold plates 540A, 540B, 540C located in the first row 520(1) may be fluidly coupled via enclosure transfer lines 556'. In some implementations, the high fin-density zones of the cold plates $540A_2$, $540B_2$, $540C_2$ located in the second row 520(2) may be fluidly coupled via enclosure transfer lines 556, while the low fin-density zones of the cold plates $540A_2$, $540B_2$, $540C_2$ located in the second row 520(2) may be fluidly coupled via enclosure transfer lines 556'. In some implementations, the high fin-density zones of cold plate 540C may be fluidly coupled to the low fin-density zones of cold plate 540C via a zone transfer line 558, while the high fin-density zone of cold plate $540C_2$ may be fluidly coupled to the low fin-density zone of cold plate $540C_2$ via a zone transfer line 558. Thus, a first flow of cooling fluid may flow through the high fin-density zones of cold plates 540A, 540B, 540C and enclosure transfer lines 556 between cold plates 540A, 540B, 540C, through zone transfer line 558, and through the low fin-density zone of cold plates 540C, 540B, and 540A and enclosure transfer lines 556'. Similarly, a second flow of cooling fluid may flow through the high fin-density zones of cold plates $540A_2$, $540B_2$, $540C_2$ and enclosure transfer lines 556 between cold plates $540A_2$, $540B_2$, $540C_2$, through zone transfer line 558, and through the low fin-density zone of cold plates $540C_2$, $540B_2$, and $540A_2$ and enclosure transfer lines 556'.

For example, a first flow of cooling fluid may be supplied from a fluid source to a first fluid inlet 542 of cold plate 540A, through the high fin-density zones 572 of cold plate 540A, cold plate 540B, and cold plate 540C via the respective first fluid inlets 542 and first fluid outlets 544. After exiting the high fin-density zone 572 of cold plate 540C via the first fluid outlet 544 of cold plate 540C, the first flow of cooling fluid is directed to the second fluid inlet 542' of cold plate 540C. The first flow of cooling fluid then flows through the low fin-density zones 574 of cold plate 540C, cold plate 540B, and cold plate 540A via the respective second fluid inlets 542' and second fluid outlets 544'. The first flow of cooling fluid is directed back to the fluid source via fluid return line 554.

Additionally, or alternatively, a second flow of cooling fluid may be supplied from a fluid source to a first fluid inlet 542 of cold plate $540A_2$, through the high fin-density zones 572 of cold plate $540A_2$, cold plate $540B_2$, and cold plate $540C_2$ via the respective first fluid inlets 542 and first fluid outlets 544. After exiting the high fin-density zone 572 of cold plate $540C_2$ via the first fluid outlet 544 of cold plate $540C_2$, the second flow of cooling fluid is directed to the second fluid inlet 542' of cold plate $540C_2$. The second flow of cooling fluid then flows through the low fin-density zones 574 of cold plate $540C_2$, cold plate $540B_2$, and cold plate $540A_2$ via the respective second fluid inlets 542' and second fluid outlets 544'. The second flow of cooling fluid is directed back to the fluid source via fluid return line 554.

Though the enclosures 500A, 500B, 500C are shown as having two rows 520 of ports 512, heatsink interfaces 530 and cold plates 540, embodiments are not limited thereto. The enclosures may have any number of rows 520 of ports 512, heatsink interfaces 530 and cold plates 540. For example, the enclosures 500A, 500B, 500C may have 1, 2, 3, 4, or 5 rows 520 of ports 512, heatsink interfaces 530 and cold plates 540.

As noted above with reference to FIG. 3B, heat from one or more heat sources of a pluggable module 200 may be transferred through a corresponding heatsink interface 530 to a corresponding cold plate 540A, $540A_2$, 540B, $540B_2$, 540C, $540C_2$. The cooling fluid may flow through the corresponding cold plates 540A, $540A_2$, 540B, $540B_2$, 540C, $540C_2$ to dissipate the transferred heat. A first flow of cooling fluid may flow through the high fin-density zone 572 and then through the low fin-density zone 574 of cold plates 540A, 540B, 540C, while a second flow of cooling fluid pass through the high fin-density zone 572 and then through the low fin-density zone 574 of cold plates $540A_2$, $540B_2$, $540C_2$. After passing through the low fin-density zones 574 of cold plates 540A, $540A_2$, the flows of cooling fluid can be directed back to the fluid cooling source. The heat transferred to the cooling fluid leaves the enclosures 500A, 500B, 500C with the cooling fluid, thereby cooling the enclosures 500A, 500B, 500C.

In some implementations, each enclosure 500A, 500B, 500C may have a separate fluid supply line 552 and fluid return line 554 for directing fluid to each cold plate in each enclosure. For example, cooling fluid may be directed to cold plate 540A of enclosure 500A. The cooling fluid may flow through the high fin-density zone 572, then through the low fin-density zone 574 of cold plate 540A, and then back to the fluid source via a fluid return line 554. A second fluid supply line (not shown) may provide cooling fluid to cold plate 540B of enclosure 500B. The cooling fluid may flow through the high fin-density zone 572, then through the low fin-density zone 574 of cold plate 540B, and then back to the fluid source via a second fluid return line (not shown). A third fluid supply line (not shown) may provide cooling fluid to cold plate 540C of enclosure 500C. The cooling fluid may flow through the high fin-density zone 572, then through the low fin-density zone 574 of cold plate 540C, and then back to the fluid source via a third fluid return line (not shown). Fluid supply lines 552 and fluid return lines 554 may similarly be independently coupled to cold plate $540A_2$, cold plate $540B_2$, and cold plate $540C_2$ for flowing cooling flows through respective high fin-density zones 572 and low fin-density zone 574 of the cold plate $540A_2$, cold plate $540B_2$, and cold plate $540C_2$.

With reference to FIG. 5B, a cross-sectional top view of a counter flow cold plate 540 of FIG. 5A is shown. The counter flow cold plate 540 includes fluid inlets 542, 542', fluid outlets 544, 544', a plurality of fins 560, and a fluid barrier 568. The plurality of fins 560 may be grouped into fin groups 561, 561', 562, 562', 563, 563', 564, 564', 565, 565'. Each of the fin groups 561, 561', 562, 562', 563, 563', 564, 564', 565, 565' may be separated from one another by gaps 566. The fin groups 561, 561', 562, 562', 563, 563', 564, 564', 565, 565' may be configured to vertically align with one or more heat sources (e.g., heat sources 210A, 210B, 210C) of a corresponding pluggable module 200. That is, gaps 566 can be disposed between each adjacent fin groups 561, 561', 562, 562', 563, 563', 564, 564', 565, 565' such that the gaps 466 are vertically aligned where the heat sources 210A, 210A, 210B from pluggable modules 200 are not present (e.g., generally where the port sidewalls 114 of the ports 112 are present).

Each fin group 561, 561', 562, 562', 563, 563', 564, 564', 565, 565' may have a variable fin-density. The fin-density of each group may be predetermined based on a power budget of the one or more heat sources 210A, 210B, 210C of the corresponding pluggable module 200. For example, each fin group 561, 561', 562, 562', 563, 563', 564, 564', 565, 565' may have a predetermined fin-density that correspond to one or more heat sources 210A, 210B, 210C of a pluggable module 200 that may be in thermal contact with the cold plate 540 and vertically aligned with the fin group.

In some implementations, two fin groups may correspond to the same pluggable module 200. For example, fin group 561 may correspond to heat sources 210A and 210B of a pluggable module 200 and fin group 561' may correspond to heat source 210C of pluggable module 200. Fin groups 562 and 562' may correspond to another set of heat sources of another pluggable module in thermal contact with the cold plate 540 and vertically aligned with fin groups 562 and 562'.

In some implementations, a fin-density of one fin group may be a different from a fin-density of another fin group. For example, fin group 561 may have a different fin-density as compared to a fin-density of fin groups 561', 562, 562', 563, 563', 564, 564', 565, and/or 565'.

In some implementations, fin groups 561, 562, 563, 564, and 565, may have a first fin-density and fin groups 561', 562', 563', 564', 565' may have a second fin-density. For example, a first plurality of fin groups 561, 562, 563, 564, 565 may be disposed in the high fin-density zone 572 of the cold plate 540, and a second plurality of fin groups 561', 562', 563', 564', 565' may be disposed in the low fin-density zone 574. That is, the first plurality of fin groups 561, 562, 563, 564, 565 may have higher fin-densities as compared to fin-densities of the second plurality of fin groups 561', 562', 563', 564', 565'. The high fin-density zone 572 may correspond to high heat flux components of a module 200 (e.g., heat source 210A, 210B, and/or 210C), and the low fin-density zone 574 may correspond to low heat flux components of the module 200, (e.g., heat source 210A, 210B, and/or 210C). That is, when the module 200 is received in an enclosure 500, high heat flux components of the module 200 may be disposed adjacent to and thermally coupled to the high fin-density zone 572, and low heat flux components of the module 200 may be disposed adjacent to and thermally coupled to the low fin-density zone 574.

The high fin-density zone 572 may be separated from the low fin-density zone 574 by the fluid barrier 568. Further, the high fin-density zone 572 and the low fin-density zone 574 of the cold plate 540 may have separate fluid inlets 542, 542' and fluid outlets 544, 544'. That is, the first fluid inlet 542 and the first fluid outlet 544 may correspond to the high fin-density zone 572, and the second fluid inlet 542' and the second fluid outlet 544' may correspond to the low fin-density zone 574. The fluid supply lines 552 supplies cooling fluid to the cold plate 540A and cold plate 540A$_2$ via respective first fluid inlets 542 (see FIG. 5A).

Referring back to FIG. 5B, arrows illustrate directions of flow of the cooling fluid through the cold plate 540. A first flow of cooling fluid 582 enters the cold plate 540 via the first fluid inlet 542, flows through the high fin-density zone 572, and exits the cold plate 540 via the first fluid outlet 544. A second flow of cooling fluid 584 enters the cold plate 540 via the second fluid inlet 542', flows through the low fin-density zone 574, and exits the cold plate 540 via the second fluid outlet 544'. Thus, the cold plate 540 utilized in the arrangement of FIG. 5A may have a counter flow arrangement. That is, the flows of cooling fluid 582, 584 can pass through the plurality of fins 560 of the fin-density zones 572, 574 in opposite directions. For example, a supply flow of cooling fluid 582 may flow in a first direction through the high fin-density zone 572, and a return flow of cooling fluid 584 may flow in a second direction, opposite to the first direction, through the low fin-density zone 574. This counter flow arrangement may be used when the cold plate 540 is utilized in one of the enclosures 500A, 500B, 500C for the cage cooling setup illustrated in FIG. 5A.

In some implementations, the cold plate 540 may include more than two fin-density zones. For example, the cold plate 540 may include high, low, and intermediate fin-density zones, each zone having a corresponding fluid inlet and fluid outlet. That is, the cold plate 540 may have three fin-density zones each having different fin densities, fluid inlets and fluid outlets separated by two fluid barriers. However, the number of fin-density zones, inlets and outlets for a cold plate may be determined based on the power budgets of one or more corresponding heatsinks of one or more pluggable modules 200.

Though the enclosures 400 and 500 illustrated in FIGS. 4A and 5A, respectively, are shown as having two rows 420, 520 of ports 412, 512, heatsink interfaces 430, 530 and cold plates 440, 540, embodiments are not limited thereto. The enclosures may have any number of rows 420, 520 of ports 412, 512, heatsink interfaces 430, 530 and/or cold plates 440, 540. For example, the enclosures 400, 500 may have 1, 2, 3, 4, and/or 5 rows 420, 520 of ports 412, 512, heatsink interfaces 430, 530 and cold plates 440, 540.

Figure 6:
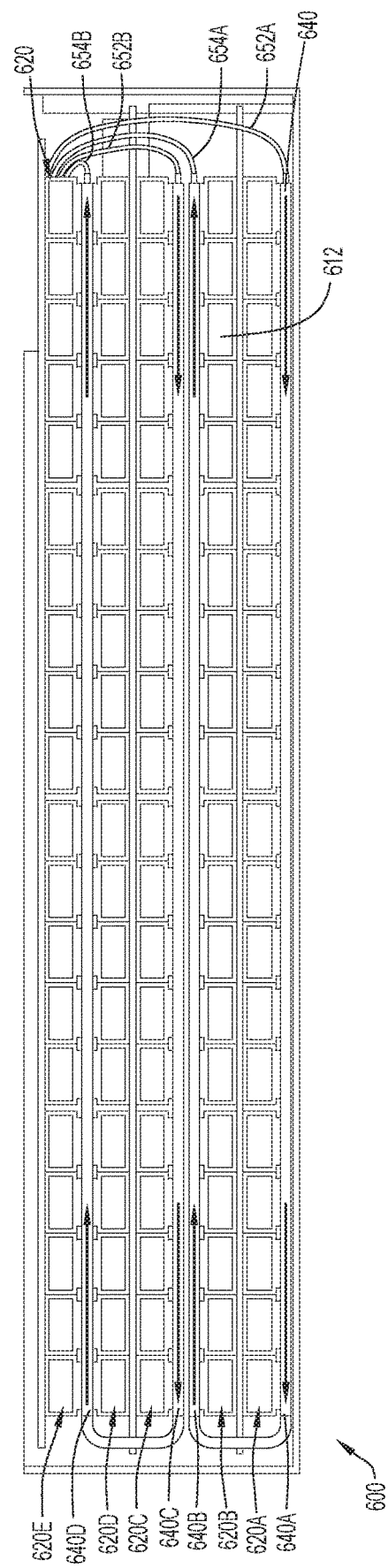
FIG. 6 is a front view of an enclosure, according to an example embodiment.

With reference to FIG. 6, a front view of an enclosure 600 is illustrated according to an example embodiment. The enclosure 600 includes five rows 620A, 620B, 620C, 620D, 620E, collectively referred to as 620, of ports 612 with four cold plates 640A, 640B, 640C, 640D, collectively represented as 640. Cold plates 640 may be representative of cold plates 140, 440, and 540 noted above. One or more cold plates 640A, 640B, 640C, 640D may be disposed between the rows 620A, 620B, 620C, 620D, 620E. For example, first and second rows 620A and 620B of ports 612 may be disposed above the first cold plate 640A. Second and third cold plates 640B and 640C may be disposed above the second row 620B. The second and third cold plates 640B and 640C may also be in thermal contact with each other. The third and fourth rows 620C and 620D may be disposed above the third cold plate 640C. The fourth cold plate 640D may be disposed above the fourth row 620D. The fifth row 620E of ports 612 may be disposed above the fourth cold plate 640D.

In the configuration shown in FIG. 6, the enclosure 600 may be configured to receive pluggable modules 200 in ports 612 in a belly-to-belly type of arrangement. That is, the pluggable modules 200 of each row 620 are oriented such that the heat sources 210A, 210B, 210C are disposed near a corresponding cold plate 640A, 640B, 640C, 640D and the belly portion 214 of a module 200 is adjacent to and facing a belly portion 214 of another pluggable module 200. For example, pluggable module 200 may be oriented such that heat source portion 212 may be disposed adjacent to a corresponding cold plate 640A, 640B, 640C, 640D. For example, the first cold plate 640A may correspond to ports 612 of the first row 620A and the second cold plate 640B may correspond to ports 612 of the second row 620B. Similarly, ports 612 of the third row 620C may correspond to the third cold plate 640C. Lastly, ports 612 of fourth and fifth rows 620D and 620E may both correspond to the fourth cold plate 640D. Thus, pluggable modules 200 disposed in ports 612 of the first row 620A correspond to the first cold plate 640A, pluggable modules 200 disposed in ports 612 of the second row 620B correspond to the second cold plate 640B, and pluggable modules 200 disposed in ports 612 of the third row 620C correspond to cold plate 640C. Finally, pluggable modules 200 disposed in ports 612 the fourth and fifth rows 620D and 620E may correspond to the fourth cold plate 640D. Accordingly, the pluggable module 200 disposed in first and second rows 620A and 620B may be oriented belly-to-belly. That is, the enclosure 600 may be configured to receive pluggable modules 200 in the first row 620A with the heat source portions 212 adjacent to the corresponding first cold plate 640A, and receive pluggable modules 200 in the second row 620B with heat source portions 212 adjacent to the corresponding second cold plate 640B. Thus, the belly portions 214 of pluggable modules 200 received in the first row 620A may be adjacent to the belly portions 214 of pluggable modules 200 received in the second row 620B. The enclosure 600 may be further configured to receive pluggable modules 200 in ports 612 of the third and fourth rows 620C and 620D in a belly-to-belly arrangement. Thus, the heat source portion 212 of the pluggable modules 200 received in row 620C may be adjacent to cold plate 640C, and the heat source portion 212 of pluggable modules 200 received in row 620D may be adjacent to cold plate 640D. Additionally, the enclosure 600 may be configured to receive pluggable modules 200 in row 620E with the heat source portion 212 adjacent to the fourth cold plate 640D. Thus, the fourth cold plate 640D dissipates heat from pluggable modules disposed in the fourth and fifth rows 620D and 620E.

A flow of cooling fluid supplied from a first fluid supply line 652A may flow through the first cold plate 640A and then through the second cold plate 640B before leaving the enclosure 600 via a first fluid return line 654A. A second flow of cooling fluid supplied from a second fluid supply line 652B may flow through the third cold plate 640C and then through fourth cold plate 640D before leaving the enclosure 600 via a second fluid return line 654B.

Heat may be transferred from the heat sources 210A, 210B, 210C of pluggable modules 200 received in rows 620 to the corresponding cold plates 640 of the enclosure 600. The heat may be transferred to and removed from the cold plates 640 via the cooling fluid. For example, the heat from the first and second cold plates 640A and 640B may be transferred to a first flow of cooling fluid. Additionally, heat may be transferred from the second cold plate 640B to the third cold plate 640C. That is, the second cold plate 640B may be thermally coupled to the third cold plate 640C. For example, the temperature of the second cold plate 640B may be higher than the third cold plate 640C. Heat may transfer from the second cold plate 640B to the third cold plate 640C due to the temperature difference. The second flow of cooling fluid may flow through the third cold plate 640C and dissipate heat transferred to the third cold plate 640C from one or more heat sources 210A, 210B, 210C of corresponding pluggable modules 200 and/or the second cold plate 640B. Additionally, or alternatively, heat from the third cold plate 640C may be transferred to the second cold plate 640B. For example, the temperature of the second cold plate 640B may be lower than a temperature of the third cold plate 640C. Heat may transfer from the third cold plate 640C to the second cold plate 640B due to the temperature difference. The first flow of cooling fluid may flow through the second cold plate 640B and dissipate heat transferred to the second cold plate 640B from one or more heat sources 210A, 210B, 210C of corresponding pluggable modules 200 and the third cold plate 640C.

While not illustrated, the cold plates 640A, 640B, 640C, 640D may have a plurality of fin-density zones as previously explained with cold plates 140 illustrated in FIG. 1C, cold plates 440 illustrated in FIG. 4B, and cold plates 540 illustrated in FIG. 5B. Each fin-density zone may include a fluid inlet, a fluid outlet, and may be coupled to fluid lines for receiving a flow of cooling fluid. For example, the cold plates 640A, 640B, 640C, 640D may each have a high fin-density zone and a low fin-density zone. The high fin-density zone may have a fin-density that is greater than a fin-density of the low fin-density zone. In some implementations, the cold plates 640A, 640B, 640C, 640D may be a unidirectional flow cold plate, such as cold plate 440 noted above with respect to FIG. 4B, while in other implementations, the cold plates 640A, 640B, 640C, 640D, may be counter flow cold plates, such as cold plate 540 noted above with respect to FIG. 5B. In even further implementations, the enclosure 600 may include both unidirectional flow and counter flow cold plates. In a unidirectional flow cold plate arrangement, a first flow of cooling fluid may flow through high fin-density zones of cold plate 640A and cold plate 640B. A second flow of cooling fluid may flow through high fin-density zones of cold plate 640C and cold plate 640D. A third flow of cooling fluid may flow through a low fin-density zone of cold plate 640A and cold plate 640B. A fourth flow of cooling fluid may flow through low fin-density zones of cold plate 640C and cold plate 640D.

In a counter flow cold plate arrangement, a first flow of cooling fluid may flow through the high fin-density zone of cold plate 640A to the low fin-density zone of cold plate 640A. A second flow of cooling fluid may flow through the high fin-density zone of cold plate 640B to the low fin-density zone of cold plate 640B. A third flow of cooling fluid may flow through the high fin-density zone of cold plate 640C to the low fin-density zone of cold plate 640C. A fourth flow of cooling fluid may flow through the high fin-density zone of cold plate 640D to the low fin-density zone of cold plate 640D.

Figure 7:
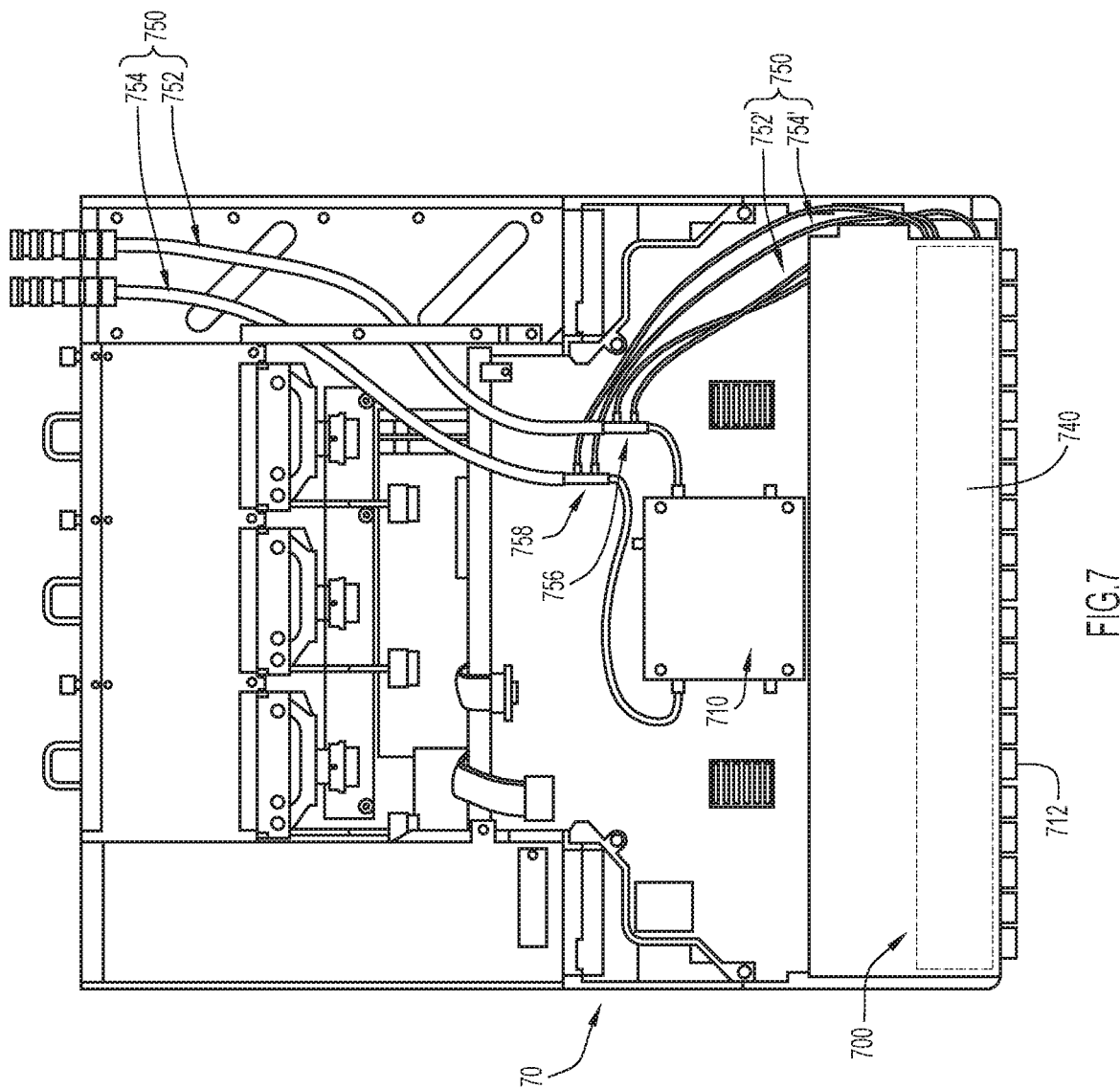
FIG. 7 is a top view of a system for cooling an enclosure, according to an example embodiment.

With reference made to FIG. 7, a system 7 for cooling an enclosure for receiving one or more pluggable modules is shown. The system includes a line card 70 having one or more fluid cooled processing modules 710 (e.g., CPUs, memory, etc.), and fluid cooled enclosure 700 having one or more ports 712 for receiving one or more pluggable modules 200. Fluid lines 750 circulate a cooling fluid through the processing module 710 and enclosure 700. Enclosure 700 may be representative of enclosure 100 of FIGS. 1A, 1B, 3A, and 3B, enclosures 400A, 400B, 400C of FIG. 4A, enclosure 500A, 500B, 500C of FIG. 5A and/or enclosure 600 of FIG. 6. Primary fluid supply lines 752 and fluid return lines 754 may be coupled to a fluid source. Cooling fluid may flow through primary fluid supply line 752 to processing module 710 and may return to the source via primary fluid return line 754. One or more enclosure fluid supply lines 752' may be fluidly connected to the primary cooling fluid supply line 752 via a fluid coupling 756 that is disposed along in the primary fluid supply line 752. Cooling fluid may flow through the one or more enclosure fluid supply lines 752' to one or more cold plates 740 disposed in the enclosure 700. One or more enclosure fluid return lines 754' may return cooling fluid from the one or more cold plates 740 to the primary fluid return line 754 via a fluid coupling 758 that is disposed along the primary fluid return line 754. Heat may be transferred from the one or more cold plates 740 to the cooling fluid as the cooling fluid flows through the one or more cold plates 740. The heat is removed from the one or more cold plates 740 by the return flow of cooling fluid. Thus, a desired temperature of enclosure 700 may be maintained.

Figure 8:
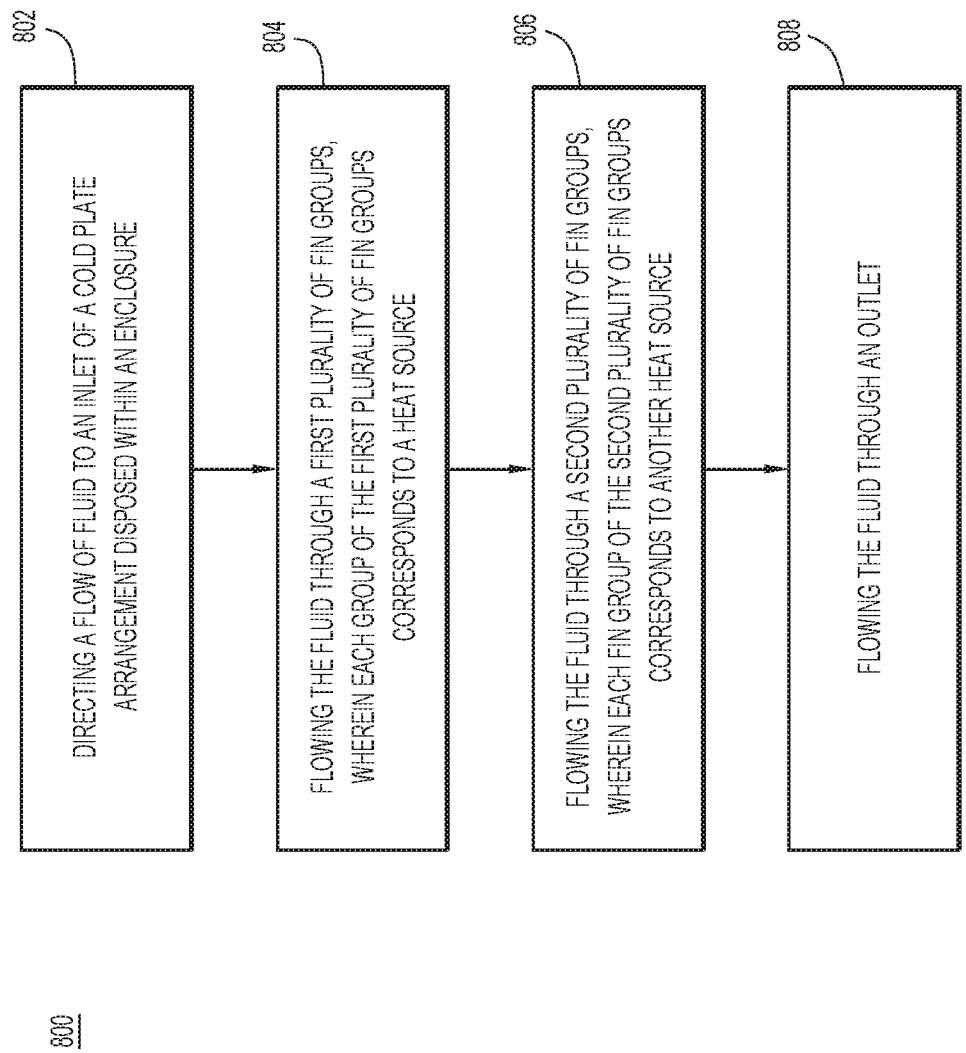
FIG. 8 is a flowchart of a method for cooling an enclosure, according to an example embodiment.

Referring to FIG. 8, illustrated is a flowchart of a method 800 for cooling an enclosure. The method includes directing a flow of fluid to an inlet of a cold plate arrangement disposed within the enclosure in operation 802; flowing the fluid through a first plurality of fin groups, wherein each group of the first plurality of fin groups corresponds to a heat source in operation 804; flowing the fluid through a second plurality of fin groups, wherein each fin group of the second plurality of fin groups corresponds to another heat source in operation 806; and flowing the fluid through an outlet in operation 808.

In operation 802, a flow of fluid is directed to an inlet of a cold plate arrangement disposed within an enclosure. For example, the cold plate arrangement may include one or more cold plates. In some implementations, referring to FIGS. 4A and 4B, a flow of cooling fluid may be supplied by fluid supply lines 452 and directed to a fluid inlet 442 (e.g., 442 and/or 442'), of a first cold plate. For example, cooling fluid may be directed to fluid inlet 442 of a first cold plate 440A. In some implementations, referring to FIGS. 5A and 5B, a flow of cooling fluid may be supplied by fluid supply lines 552 and directed to fluid inlet 542 and/or 542', of a first cold plate. For example, cooling fluid may be directed to fluid inlet 542 of a first cold plate 540A.

In operation 804, the fluid may flow through a first plurality of fin groups, wherein each fin group of the first plurality of fin groups may be aligned with a heat source of a pluggable module 200. For example, referring to FIGS. 4A and 4B, the first plurality of fin groups may be fin groups 461, 462, 463, 464, and/or 465 of a first cold plate 440A. Each fin group 461, 462, 463, 464, 465 of the cold plate may be aligned with and disposed adjacent to the heat sources 210A and/or 210B of a pluggable module 200 (see FIGS. 2 and 3B). For example, cooling fluid may flow through fin groups 461, 462, 463, 464, and 465 of the first cold plate 440A. Heat may be transferred from the heat sources 210A and/or 210B of the pluggable modules 200 to each fin group 461, 462, 463, 464, and 465. The heat may be transferred from fin groups 461, 462, 463, 464, and 465 to the cooling fluid as it flows through the cold plate 440A. In some implementations, the first plurality of fin groups may be disposed in a high fin-density zone 472 of the cold plate 440A. In some implementations, the first plurality of fin groups may be disposed in a low fin-density zone 474 of the cold plate 440A. In some implementations, the first plurality of fin groups may be fin groups 461', 462', 463', 464', and/or 465' of cold plate 440A. For example, fin groups 461', 462', 463', 464', and/or 465' may be disposed in a low fin-density zone of cold plate 440A.

In some implementations, referring to FIGS. 5A and 5B, the fluid may flow through fin groups 561, 562, 563, 564, and/or 565 of a cold plate 540A. Each fin group 561, 562, 563, 564, 565 of the cold plate may be aligned with and disposed adjacent to the heat sources 210A and/or 210B of a pluggable module 200 (see FIGS. 2 and 3B). For example, cooling fluid may flow through fin groups 561, 562, 563, 564, and 565 of the first cold plate 540A. Heat may be transferred from the heat sources 210A and/or 210B of the pluggable modules 200 to each fin group 561, 562, 563, 564, and 565. The heat may be transferred from fin groups 561, 562, 563, 564, and 565 to the cooling fluid as it flows through the cold plate 540A. In some implementations, the first plurality of fin groups may be disposed in a high fin-density zone 572 of the cold plate 540A. In some implementations, the first plurality of fin groups may be disposed in a low fin-density zone 574 of the cold plate 540A.

In operation 806, the fluid may flow through a second plurality of fin groups, wherein each fin group of the second plurality of fin groups may be aligned with another one or more heat sources 210A, 210B and/or 210C of a pluggable module 200 (see FIGS. 2 and 3A). Heat may be transferred from the heat sources 210A, 210B and/or 210C of the pluggable module 200 to the second plurality of fin groups. As the fluid flows through the second plurality of fin groups, the heat may be transferred from the second plurality of fin groups to the fluid. For example, referring to FIGS. 4A and 4B, the second plurality of fin groups may be fin groups 461, 462, 463, 464, and/or 465 of a second cold plate 440B or second cold plate 440A$_2$. In some implementations where the first plurality of fin groups are fin groups 461', 462', 463', 464', and/or 465' of cold plate 440A and the second plurality of fin groups may be fin groups 461', 462', 463', 464', and/or 465' of the second cold plate 440B or second cold plate 440A$_2$. In some implementations, the first plurality of fin groups may be disposed in a high fin-density zone 472 of cold plate 440A and the second plurality of fin groups may be disposed in a high fin-density zone 472 of the second cold plate 440B or second cold plate 440A$_2$. In some implementations, the flow may continue to high fin-density zones 472 of cold plate 440B, cold plate 440C, cold plate 440C$_2$, cold plate 440B$_2$, and cold plate 440A$_2$. In some implementations, the cooling flow may continue to flow from the low fin-density zones 474 of cold plate 440A, cold plate 440B, cold plate 440C, cold plate 440C$_2$, cold plate 440B$_2$, and cold plate 440A$_2$. Heat may be transferred the fluid as the fluid flows through each cold plate.

In some implementations, referring to FIGS. 5A and 5B, the second plurality of fin groups may be disposed in a first cold plate 540A. For example, the cooling fluid may flow through fin groups 561', 562', 563', 564', and/or 565' of cold plate 540A. Each fin group 561', 562', 563', 564', and/or 565' may be aligned with and disposed adjacent to heat sources 210B and/or 210C of a pluggable module 200 (see FIGS. 2 and 3B). Heat may be transferred to the fin groups 561', 562', 563', 564', and/or 565' from the heat sources 210B and/or 210C of the pluggable modules 200. The heat may be transferred from the fin groups 561', 562', 563', 564', and/or 565' to the cooling fluid as it flows through the cold plate 540A. In some implementations, the second plurality of fin groups 561', 562', 563', 564', and/or 565' may be disposed in a low fin-density zone 574 of the cold plate 540A.

In some implementations, the second plurality of fin groups may be disposed in a second cold plate 540B. For example, the second plurality of fin groups may be fin groups 561, 562, 563, 564, and 565 of cold plate 540A. That is, the fluid flow from a first plurality fin groups of the first cold plate 540A to a second plurality fin groups of a second cold plate 540B. In some implementations, the second plurality of fin groups of the second cold plate 540B may be disposed in a high fin-density zone 572 of the second cold plate 540B.

In some implementations, the flow may continue to a high fin-density zones 572 of cold plates 540B and 540C. In some implementations the cooling flow may then flow through a low fin-density zone of 574 of cold plate 540C, through a low fin-density zone of 574 of cold plate 540B, and through a low fin-density zone of 574 of cold plate 540A.

In operation 808, the fluid flows through an outlet, thereby carrying and removing heat transferred from the fin groups to the fluid. For example, referring to FIGS. 4A and 4B, the outlet may be fluid outlets 444 or 444' of cold plate 440A or cold plate 440A$_2$. In some implementations, the cooling fluid may flow through additional fin groups before exiting the fluid outlet 444 of cold plate 440A$_2$. For example, the cooling fluid may flow through fin groups disposed in the high fin-density zones 472 of cold plates 440A, 440B, 440C and then through fin groups disposed the high fin-density zones 472 of cold plate 440C$_2$, cold plate 440B$_2$, and cold plate 440A$_2$. In some implementations, the cooling fluid may flow through additional fin groups before exiting the second outlet 444' of cold plate 440A$_2$. For example, the cooling fluid may flow through fin groups disposed in the low fin-density zones 474 of cold plates 440A, 440B, 440C and then through fin groups disposed the low fin-density zones 474 of cold plate 440C$_2$, cold plate 440B$_2$, and cold plate 440A$_2$.

In some implementations, referring to FIGS. 5A and 5B, the outlet may be the second outlet 544' may of cold plate 540A. In some implementations, the cooling fluid flows through additional fin groups before exiting the outlet 544'. For example, the cooling fluid may flow through fin groups disposed in the high fin-density zones 572 of cold plates 540A, 540B, 540C and then through fin groups disposed in the low density zones 574 of cold plates 540C, 540B, and 540A. The cooling fluid may be returned to the cooling fluid source after exiting the outlet 444, 444', and/or 544'.

In some implementations, a second flow of cooling fluid may through a third plurality of fin groups. The third plurality of fin groups may be disposed in a low fin-density zone 474 of a cold plate 440 (see FIGS. 4A and 4B). For example, the second flow of cooling fluid may flow through a fin groups 461', 462', 463', 464', and/or 465' of cold plate 440A.

In some implementations, referring to FIGS. 5A and 5B, the third plurality of fin groups may be fin groups 561, 562, 563, 564, and 565 of cold plate 540A$_2$. For example, the third plurality of fin groups may be disposed in a high fin-density zone in cold plate 540A$_2$.

In some implementations, individual fluid supply lines 452, 552 may supply cooling fluid to, and independent fluid return lines 454, 554 may return cooling fluid from, the plurality fin groups of each cold plate 440, 540. That is, cooling fluid may flow through a single cold plate 440, 540 and be returned to the fluid source.

The description of the method 800 above is described with respect to the embodiment disclosed with reference to FIGS. 4A-5B, however the method may be applied to any embodiment disclosed herein. For example, the enclosure may be representative of enclosure 100 of FIGS. 1A, 1B, 3A and 3B, enclosures 400A, 400B, 400C of FIG. 4A, enclosures 500A, 500B, 500C of FIG. 5A, enclosure 600 of FIG. 6, and/or enclosure 700 of FIG. 7. The first cold plate of method 800 may be representative of cold plate 140 of FIG. 1; cold plate 440A, 440B, 440C, 440A$_2$, 440B$_2$, and/or 440C$_2$ of FIGS. 4A and 4B, cold plate 540A, 540B, 540C, 540A$_2$, 540B$_2$, and/or 540C$_2$ of FIGS. 5A and 5B, cold plates 640 of FIG. 6; and/or cold plate 740 of FIG. 7. The first plurality of fin groups may be representative of fin groups 461, 461', 462, 462', 463, 463', 464, 464', 465, 465' of FIG. 4B and/or fin groups 561, 561', 562, 562', 563, 563', 564, 564', 565, 565' of FIG. 5B.

Accordingly, heat generated by one or more heatsinks of one or more pluggable modules may be transferred to one or more cold plates and the cooling fluid flowing therethrough. The cooling fluid may then carry the heat out of cold plates and the system, thus maintaining a desired temperature of the one or more enclosures. In some implementations, the cooling fluid is a dielectric liquid.

The versatility of setting fin densities for each fin group of each cold plate based on the power budgets of corresponding pluggable modules, according to example embodiments described above, provides desired cooling of pluggable modules and enclosures. Pressure losses of the flow of cooling fluid may be minimized based on the arrangement a plurality of fin groups of one or more cold plates having variable fin densities. For example, a cooling fluid pressure drop of 0.25 to 1.4 pounds per square inch (PSI) per cold plate may be achieved at flow rates of up to one (1) gallon per minute. For example, fin densities of fin groups of one or more cold plates of one or more enclosures may be selected and arranged based on power budgets of heat sources of desired pluggable modules and fluid dynamics considerations of the flow through the one or more cold plates. Accordingly, the arrangement and density of the plurality of fin groups may be selected to remove the heat from the heat sources while limiting pressure drops to no more than 1.4 PSIs per cold plate. Therefore, enclosures for one or more pluggable modules may be efficiently maintained at desired temperatures.

According to an example embodiment, a system includes a cage housing and a plurality of plates disposed within the cage housing. Each plate includes an interior chamber, a first fluid inlet, and a first fluid outlet. The interior chamber includes a first fin zone, a second fin zone, and a plurality of fins disposed in the first fin zone and second fin zone.

In one form of the system, each plate of the plurality of plates further includes a second fluid inlet and a second fluid outlet. The fins disposed in first fin zone have a first fin-density, and the fins disposed in the second fin zone have a second fin-density In one form of the system, the first fluid outlet of a first plate of the plurality of plates is fluidly coupled to the first fluid inlet of a second plate of the plurality of plates.

In one form of the system, one or more cage housings fit within a 1 rack unit (RU) or 2 RU form factor.

In one form of the system, each plate of the plurality of plates further includes a fluid barrier separating the first fin zone from the second fin zone. The first fluid inlet and first fluid outlet are fluidly coupled to the first fin zone of the interior chamber. The second fluid inlet and second fluid outlet are fluidly coupled to the second fin zone of the interior chamber.

In one form of the system, the first fluid outlet of a first plate of the plurality of plates is fluidly coupled to the second fluid inlet of the first plate of the plurality of plates.

According to another example embodiment, a method of cooling pluggable modules received in a cage includes directing a flow of fluid to an inlet of a cold plate arrangement, flowing the fluid through a first plurality of fin groups. A first fin-density of each fin group of the first plurality of fin groups corresponds to a first heat source. The method further includes flowing the fluid through a second plurality of fin groups. A second fin-density of each fin group of the second plurality of fin groups corresponds to a second heat source that differs from the first heat source. The method further includes flowing the fluid through an outlet of the cold plate arrangement.

In one form of the method, the first plurality of fin groups and second plurality of fin groups are disposed in a first cold plate of the cold plate arrangement.

In one form of the method, the first plurality of fin groups defines a high fin-density zone, and the second plurality of fin groups defines a low fin-density zone.

In one form of the method, the first plurality of fin groups is disposed within a first cold plate of the cold plate arrangement, and the second plurality of fin groups is disposed in a second cold plate of the cold plate arrangement, the second cold plate being fluidly coupled to the first cold plate.

In one form of the method, the inlet is a first inlet of the cold plate arrangement and the outlet is a first outlet of the cold plate arrangement. The method further includes directing a second flow of fluid to a second inlet of the cold plate arrangement and directing the second flow through a third plurality of fin groups. The third plurality of fin groups are disposed in the first cold plate and define a first low fin-density zone of the cold plate arrangement. The method further includes directing the second flow through a fourth plurality of fin groups. The fourth plurality of fin groups are disposed in the second cold plate and define a second low fin-density zone of the cold plate arrangement. The first inlet and the second inlet are disposed at the first cold plate and the first outlet and the second outlet are disposed at the second cold plate.

In one form of the method, the first plurality of fin groups define a first high fin-density zone of the cold plate arrangement, and the second plurality of fin groups define a second high fin-density zone of the cold plate arrangement.

In one form of the method, the first fin-density of the first plurality of fin groups is configured to cool a first heat source budget, and the second fin-density of the second plurality of fin groups is configured to cool a second heat source budget that differs from the first heat source budget.

In one form of the method, the method further includes transferring heat from each heat source to the first and second plurality of fin groups, and then transferring the heat from the first and second plurality of fin groups to the flow of fluid.

According to yet another example embodiment, a cold plate includes an interior chamber. The interior chamber includes a first fin zone and a second fin zone. A plurality of fins is disposed in the first fin zone and the second fin zone. The cold plate further includes a first fluid inlet and a first fluid outlet.

In one form of the cold plate, the plurality of fins in the first fin zone are organized into a first set of fin groups that are separated by gaps, and the plurality of fins in the second fin zone are organized into a second set of fin groups that are separated by the gaps.

In one form of the cold plate, each fin group of the first and second sets of fin groups corresponds to a predetermined heat source.

In one form of the cold plate, the cold plate further includes a second fluid inlet and a second fluid outlet.

In one form of the cold plate, the cold plate further comprises a fluid barrier separating the first fin zone from the second fin zone. The fins disposed in the first fin zone have a first fin-density, and the fins disposed in the second fin zone have a second fin-density.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. A system comprising:
 a cage housing; and
 a plurality of plates disposed within the cage housing, each plate comprising:
  an interior chamber, the interior chamber comprising:
   a first interior surface,
   a second interior surface opposite the first interior surface,
   a first fin zone,
   a second fin zone,
   a plurality of fins disposed in the first fin zone and the second fin zone, the plurality of fins extending from the second interior surface towards the first interior surface, wherein fins disposed in the first fin zone have a first fin-density, and fins disposed in the second fin zone have a second fin-density different from the first fin-density; and
   a fluid barrier fluidly separating the first fin zone from the second fin zone;
  a first inlet port defining a first fluid inlet to the interior chamber;
  a first outlet port defining a first fluid outlet from the interior chamber;
  a second inlet port defining a second fluid inlet to the interior chamber; and
  a second outlet port defining a second fluid outlet from the interior chamber,
  wherein the first fluid inlet, the first fin zone, and the first fluid outlet are configured to guide a first flow of fluid through the interior chamber, and the second fluid inlet, the second fin zone, and the second fluid outlet are configured to guide a second flow of fluid through the interior chamber.

2. The system of claim 1, wherein the first fluid outlet of a first plate of the plurality of plates is fluidly coupled to the first fluid inlet of a second plate of the plurality of plates.

3. The system of claim 2, wherein the second fluid inlet of the first plate of the plurality of plates is fluidly coupled to the second fluid outlet of the second plate of the plurality of plates.

4. The system of claim 1, wherein the first fluid outlet of a first plate of the plurality of plates is fluidly coupled to the second fluid inlet of the first plate of the plurality of plates.

5. The system of claim 1, wherein the first fluid inlet is fluidly coupled to a fluid supply line and the second fluid outlet is fluidly coupled to a return line.

6. A cold plate comprising:
 an interior chamber, the interior chamber comprising:
  a first interior surface,
  a second interior surface opposite the first interior surface,
  a first fin zone comprising fins with a first fin-density, wherein the fins in the first fin zone are organized into a first set of fin groups that are separated by gaps,
  a second fin zone comprising fins having a second fin-density different from the first fin-density, wherein the fins in the second fin zone are organized into a second set of fin groups that are separated by gaps,
  the fins disposed in the first fin zone and the fins in the second fin zone extend from the second interior surface towards the first interior surface, and
  a solid fluid barrier completely fluidly separating the first fin zone from the second fin zone;
 a first fluid inlet;
 a first fluid outlet;
 a second fluid inlet; and
 a second fluid outlet.

7. The cold plate of claim 6, wherein each fin group of the first and second sets of fin groups corresponds to a predetermined heat source.

8. The cold plate of claim 6, wherein the first fluid inlet, the first fin zone, and the first fluid outlet define a first fluid path through the cold plate.

9. The cold plate of claim 8, wherein the second fluid inlet, the second fin zone, and the second fluid outlet define a second fluid path through the cold plate.

10. The cold plate of claim 6, wherein the first fluid outlet fluidly couples the cold plate to a first fluid inlet of a second cold plate.

11. The cold plate of claim 10, wherein the second fluid inlet fluidly couples the cold plate to a fluid outlet of the second cold plate.

12. A system comprising:
a cage housing configured to receive a plurality of pluggable modules, each pluggable module having a first heat source and a second heat source; and
a cold plate disposed within the cage housing, the cold plate comprising an interior chamber that includes:
a first interior surface,
a second interior surface opposite the first interior surface,
a plurality of fin groups extending from the second interior surface towards the first interior surface, the plurality of fin groups configured to align with the plurality of pluggable modules, each fin group having a first fin zone having a first fin-density and a second fin zone having a second fin-density different from the first fin-density, and
a solid fluid barrier completely fluidly dividing the interior chamber between the first fin zone and the second fin zone.

13. The system of claim 12, wherein the first fin zone of each fin group of the plurality of fin groups is configured to align with the first heat source of a respective pluggable module of the plurality of pluggable modules, and the second fin zone of each fin group of the plurality of fin groups is configured to aligned with the second heat source of a respective pluggable module of the plurality of pluggable modules.

14. The system of claim 12, wherein the first fin-density is greater than the second fin-density.

15. The system of claim 12, wherein the cold plate further comprising a first inlet and a first outlet opposite the first inlet.

16. The system of claim 15, wherein the first inlet and the first outlet are fluidly coupled with the first fin zone.

17. The system of claim 15, wherein the cold plate further comprises a second inlet and a second outlet opposite the second inlet.

18. The system of claim 17, wherein the second inlet and the second outlet are fluidly coupled with the second fin zone.

19. The system of claim 17, wherein the first inlet, the first fin zone, and the first outlet define a first fluid path through the cold plate.

20. The system of claim 19, wherein the second inlet, the second fin zone, and the second outlet define a second fluid path through the cold plate.

* * * * *